(12) United States Patent
Nakajima et al.

(10) Patent No.: US 7,696,558 B2
(45) Date of Patent: Apr. 13, 2010

(54) SEMICONDUCTOR MEMORY DEVICE FOR STORING DATA AS STATE OF MAJORITY CARRIERS ACCUMULATED IN CHANNEL BODY AND METHOD OF MANUFACTURING THE SAME

(75) Inventors: Hiroomi Nakajima, Yokohama (JP); Kazumi Inoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 11/761,889

(22) Filed: Jun. 12, 2007

(65) Prior Publication Data

US 2007/0228489 A1    Oct. 4, 2007

Related U.S. Application Data

(63) Continuation of application No. 10/994,629, filed on Nov. 23, 2004, now Pat. No. 7,301,195.

(30) Foreign Application Priority Data

Feb. 2, 2004    (JP)    ............................ 2004-025935

(51) Int. Cl.
*H01L 29/74*    (2006.01)
*H01L 29/80*    (2006.01)
*H01S 3/00*    (2006.01)

(52) U.S. Cl. .................. 257/315; 257/314; 257/316; 257/324; 365/185

(58) Field of Classification Search ............... 257/315, 257/314, 316, 324; 438/257–264; 365/185
See application file for complete search history.

(56) References Cited

U.S. PATENT DOCUMENTS 5,350,938 A * 9/1994 Matsukawa et al. ......... 257/378

6,111,286 A * 8/2000 Chi et al. .................... 257/315
6,734,490 B2 * 5/2004 Esseni et al. ................ 257/315
2006/0246605 A1 * 11/2006 Jung et al. ....................... 438/1

FOREIGN PATENT DOCUMENTS

JP    8-213624    8/1996
JP    9-509284    9/1997

(Continued)

OTHER PUBLICATIONS

Takashi Ohsawa, et al., "Memory Design Using a One-Transistor Gain Cell on SOI", IEEE Journal of Solid-State Circuits, vol. 37, No. 11, Nov. 2002, pp. 1510-1522.
S. Okhonin, et al., "A Capacitor-Less 1T-DRAM Cell", IEEE Electron Device Letters, vol. 23, No. 2, Feb. 2002, pp. 85-87.

*Primary Examiner*—Long Pham
*Assistant Examiner*—Steven H Rao
(74) *Attorney, Agent, or Firm*—Oblon, Spivak, McClelland, Maier & Neustadt, L.L.P.

(57) ABSTRACT

A semiconductor memory device comprises a substrate; a semiconductor layer of a first conductive type isolated from the substrate by an insulator layer; a memory transistor having a gate electrode, a drain and a source regions of a second conductive type formed in the semiconductor layer, and a channel body of the first conductive type formed in the semiconductor layer between the regions, the memory transistor operative to store data as a state of majority carriers accumulated in the channel body; an impurity-diffused region of the first conductive type formed at a location in contact with the upper surface of the drain region, the impurity-diffused region having a higher impurity concentration of the first conductive type than an impurity concentration of the second conductive type in the drain region; and a write transistor including a bipolar transistor having the impurity-diffused region as an emitter region, the drain region as a base region and the channel body as a collector region, the write transistor operative to write data in the memory transistor.

11 Claims, 26 Drawing Sheets

FOREIGN PATENT DOCUMENTS

| | | |
|---|---|---|
| JP | 10-154759 | 6/1998 |
| JP | 2003-17588 | 1/2003 |
| JP | 2003-31693 | 1/2003 |
| JP | 2003-31696 | 1/2003 |
| JP | 2003-68877 | 3/2003 |
| JP | 2003-282738 | 10/2003 |
| JP | 2005-79314 | 3/2005 |
| JP | 2005-175090 | 6/2005 |

* cited by examiner

SEMICONDUCTOR MEMORY DEVICE FOR STORING DATA AS STATE OF MAJORITY CARRIERS ACCUMULATED IN CHANNEL BODY AND METHOD OF MANUFACTURING THE SAME

CROSS-REFERENCE TO RELATED APPLICATIONS

This application is a Continuation of and claims benefit of U.S. Ser. No. 10/994,629, filed Nov. 23, 2004 and claims the benefit of priority from the prior Japanese Patent Application No. 2004-025935, filed on Feb. 2, 2004; the entire contents of which are incorporated herein by reference.

BACKGROUND OF THE INVENTION

1. Field of the Invention

The present invention relates to a semiconductor memory device, for example, a semiconductor memory device for storing data as a state of majority carriers accumulated in a channel body of a transistor formed in a substrate such as an SOI substrate, and method of manufacturing the same.

2. Description of the Related Art

A semiconductor memory device that can achieve dynamic storage in a simpler cell structure has been proposed recently for the purpose of replacing DRAM (JP 2002/343886A, FIGS. 1-4). A memory cell includes a transistor having a floating body (channel body) formed in an SOI substrate. The memory cell can achieve binary storage as a first data state (for example, data "1") in which excess majority carriers are accumulated in the body and a second data state (for example, data "0") in which excess majority carriers are released from the body.

Such the memory cell is called a "FBC (floating body cell)" and the semiconductor memory device using the FBC is called a "FBC memory". The FBC memory is not provided with a capacitor that is employed in a normal DRAM. Therefore, it has a simple cell array structure and a small unit cell area, and accordingly it can be highly integrated easily.

Similar to other conventional semiconductor memory devices such as DRAM, the FBC is also desired for quick writing of data and preventing occurrences of data destruction.

BRIEF SUMMARY OF THE INVENTION

A device aspect of the present invention is directed to a semiconductor memory device, comprising: a substrate; a semiconductor layer of a first conductive type isolated from the substrate by an insulator layer; a memory transistor having a gate electrode, a drain and a source regions of a second conductive type formed in the semiconductor layer, and a channel body of the first conductive type formed in the semiconductor layer between the regions, the memory transistor operative to store data as a state of majority carriers accumulated in the channel body; an impurity-diffused region of the first conductive type formed at a location in contact with the upper surface of the drain region, the impurity-diffused region having a higher impurity concentration of the first conductive type than an impurity concentration of the second conductive type in the drain region; and a write transistor including a bipolar transistor having the impurity-diffused region as an emitter region, the drain region as a base region and the channel body as a collector region, the write transistor operative to write data in the memory transistor.

Another device aspect of the present invention is directed to a semiconductor memory device, comprising: a substrate; a semiconductor layer of a first conductive type isolated from the substrate by an insulator layer; a plurality of memory transistors, each having a gate electrode, a pair of impurity regions of a second conductive type formed in the semiconductor layer, and a channel body of the first conductive type formed in the semiconductor layer between the regions, the memory transistor operative to store data as a state of majority carriers accumulated in the channel body; an interlayer insulator film formed to cover the plurality of memory transistors; and a conductive plug shared by memory transistors in which one of the pair of impurity regions being adjacent each other among the plurality of memory transistors, formed in and projected through the interlayer insulator film, and buried in one of the pair of impurity regions.

A method aspect of the present invention is directed to a method of manufacturing a semiconductor memory device, comprising: forming a memory transistor having a gate electrode, a drain and a source regions of a second conductive type formed in a semiconductor layer of a first conductive type isolated from a substrate by an insulator layer, and a channel body of the first conductive type formed in the semiconductor layer between the regions; forming an interlayer insulator film to cover the memory transistor; forming an emitter contact hole in the interlayer insulator film to expose the drain region; forming an emitter plug of the first conductive type in the emitter contact hole; and forming an emitter region of the first conductive type in the upper surface of the drain region by thermally diffusing an impurity of the first conductive type from inside the emitter plug to the upper surface of the drain region, the emitter region having a higher impurity concentration of the first conductive type than an impurity concentration of the second conductive type in the drain region.

Another method aspect of the present invention is directed to a method of manufacturing a semiconductor memory device, comprising: forming a memory transistor having a gate electrode, a drain and a source regions of a second conductive type formed in a semiconductor layer of a first conductive type isolated from a substrate by an insulator layer, and a channel body of the first conductive type formed in the semiconductor layer between the regions; forming an interlayer insulator film to cover the memory transistor; forming an emitter contact hole in the interlayer insulator film to expose the drain region; and forming a single crystalline layer of the first conductive type serving as an emitter region in the emitter contact hole by selective epitaxial growth.

A further method aspect of the present invention is directed to a method of manufacturing a semiconductor memory device, comprising: forming a plurality of memory transistors, each having a gate electrode, a pair of impurity regions of a second conductive type formed in a semiconductor layer of a first conductive type isolated from a substrate by an insulator layer, and a channel body of the first conductive type formed in the semiconductor layer between the regions, in which adjacent memory transistors share one of the pair of impurity regions; forming an interlayer insulator film to cover the plurality of memory transistors; forming a contact hole in the interlayer insulator film as entering inside one of the pair of impurity regions; and forming a conductive plug in the contact hole as entering inside one of the pair of impurity regions and as being shared by adjacent memory transistors.

DETAILED DESCRIPTION OF THE INVENTION

Figure 1:
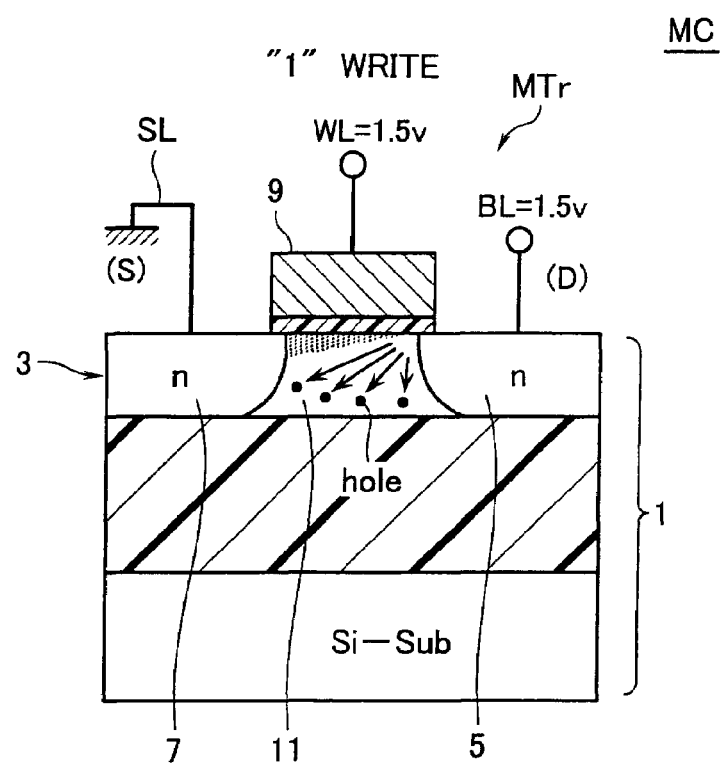
FIG. 1 is an illustrative view showing "1" write operation in a memory cell according to a first comparative example.

The embodiments of the present invention will be described in accordance with the items as classified below. A memory cell means the FBC.

First Embodiment

First Comparative Example
Second Comparative Example
Structure of Memory Cell in First Embodiment
Main Effects of First Embodiment
Method of Manufacturing Memory Cell in First Embodiment
Cell Array in First Embodiment Second Embodiment Third Embodiment Fourth Embodiment Fifth Embodiment Structure of Memory Cell in Fifth Embodiment
Main Effects of Fifth Embodiment
Method of Manufacturing Memory Cell in Fifth Embodiment Sixth Embodiment Seventh Embodiment In the figures for showing the embodiments, the same parts as those once explained are given the same reference numerals to omit further explanations.

First Embodiment

Prior to description of a memory cell according to a first embodiment, in order to provide an understanding of the same, a first and a second comparative examples are described first.

First Comparative Example

FIG. 1 is a schematic cross-sectional view of a memory cell according to the first comparative example. The memory cell MC comprises a single memory transistor MTr. The memory transistor MTr is formed on an SOI substrate 1. The memory transistor MTr includes an n-type drain region 5 and an n-type source region 7 formed in a p-type semiconductor layer 3 of the SOI substrate 1, and a gate electrode 9 disposed on the semiconductor layer 3 via a gate insulator film. A p-type channel body 11 is formed in the semiconductor layer 3 between the drain region 5 and the source region 7 immediately beneath the gate electrode 9. The channel body 11 is a floating body. The gate electrode 9 is connected to a word line WL, the drain region 5 to a bit line BL, and the source region 7 to a source line SL, which is grounded.

Figure 2:
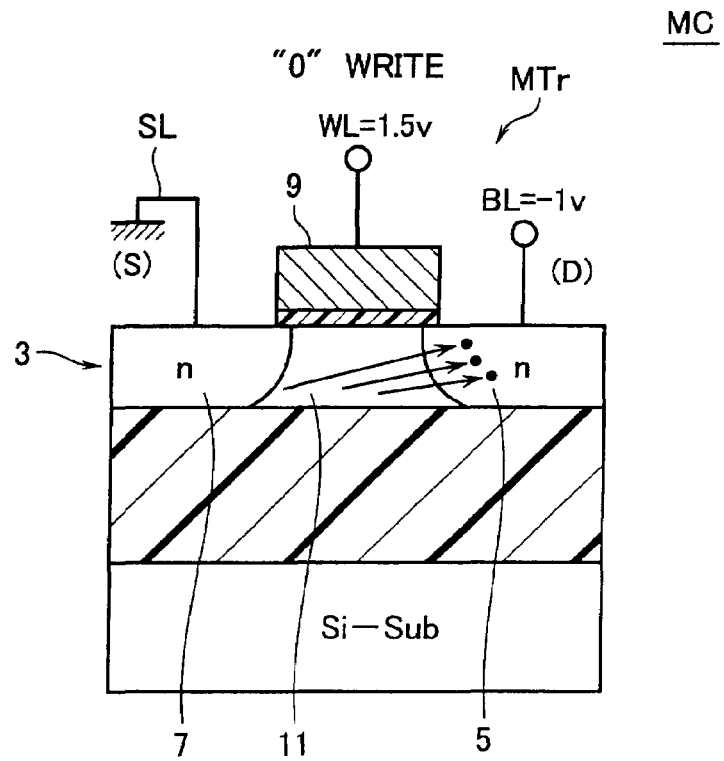
FIG. 2 is an illustrative view showing "0" write operation in the same memory cell.
Figure 3:
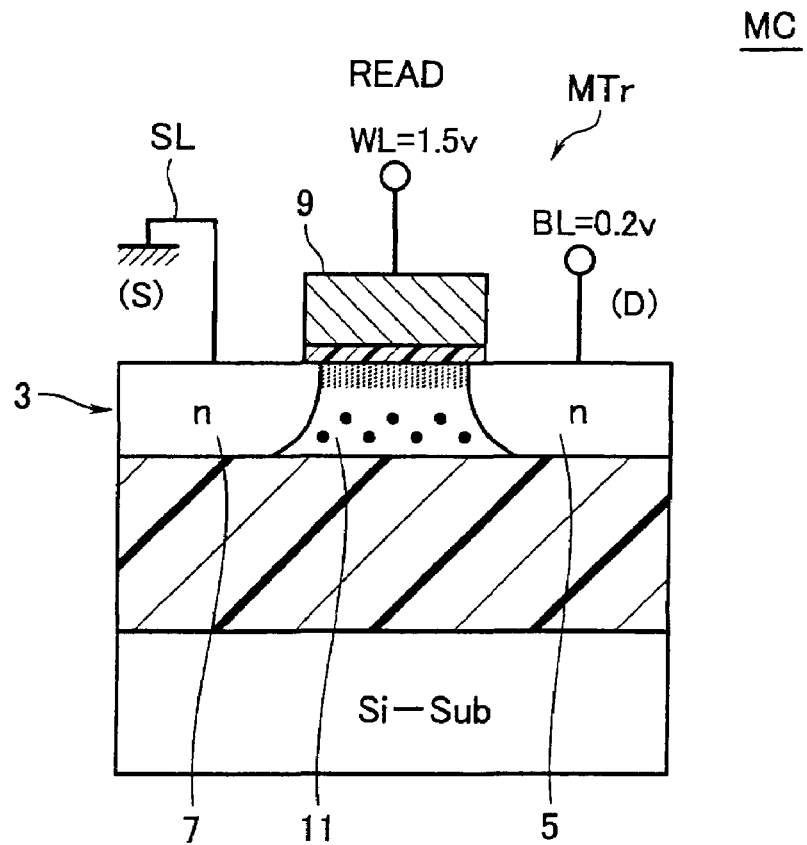
FIG. 3 is an illustrative view showing read operation in the same memory cell.

Operations in the memory cell MC are described with reference to FIGS. 1-3. FIGS. 2 and 3 show the same sectional structure as that shown in FIG. 1. FIG. 1 shows data "1" write operation, FIG. 2 data "0" write operation, and FIG. 3 data read operation.

As shown in FIG. 1, on write of data "1" into the memory cell MC, a certain bias condition is given to allow a large channel current to flow in the memory cell MC. For example, 1.5 V is applied to the word line WL and 1.5 V to the bit line BL. As a result, majority carriers (holes in the shown example) are generated due to impact ionization in the vicinity of the drain region 5 and accumulated in the channel body 11.

On the other hand, on write of data "0", as shown in FIG. 2, 1.5 V is applied to the word line WL and −1 V to the bit line BL, for example. As a result, majority carriers are released from the channel body 11 to the drain region 5 because a PN junction between the drain region 5 and the channel body 11 is forward biased.

A difference in state of carriers accumulated in the body 11 results in a difference in threshold of the memory transistor MTr. Accordingly, as shown in FIG. 3, 1.5 V is applied to the word line WL and 0.2 V to the bit line BL, for example, to detect the presence/absence or magnitude of a cell current to read out data "0" or "1".

Figure 4:
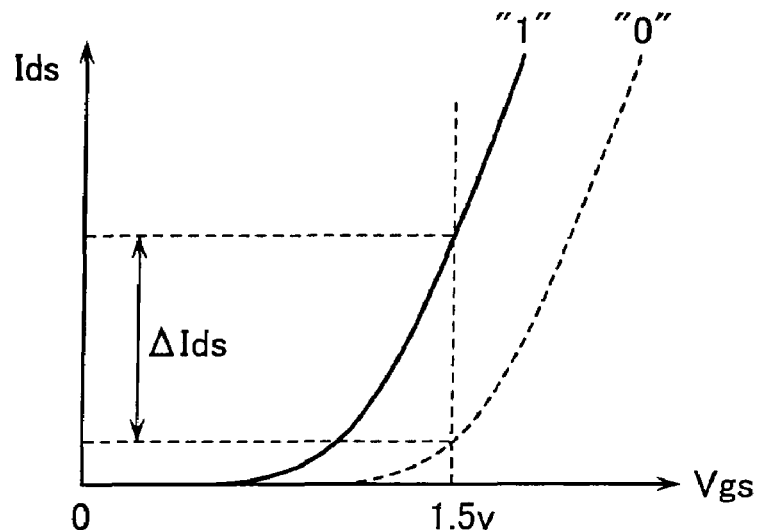
FIG. 4 is a graph showing a voltage-current characteristic of the same memory cell.

FIG. 4 shows a characteristic of Ids-Vgs (Drain current-Gate voltage) in the memory transistor MTr in terms of data "0" and "1". The excess majority carriers in the channel body 11 gradually escape from it through the PN junction between the drain region 5 and the source region 7 while they are left for a long time. Therefore, it is required to perform refresh operations in certain cycles like in a DRAM.

Second Comparative Example

Figure 5:
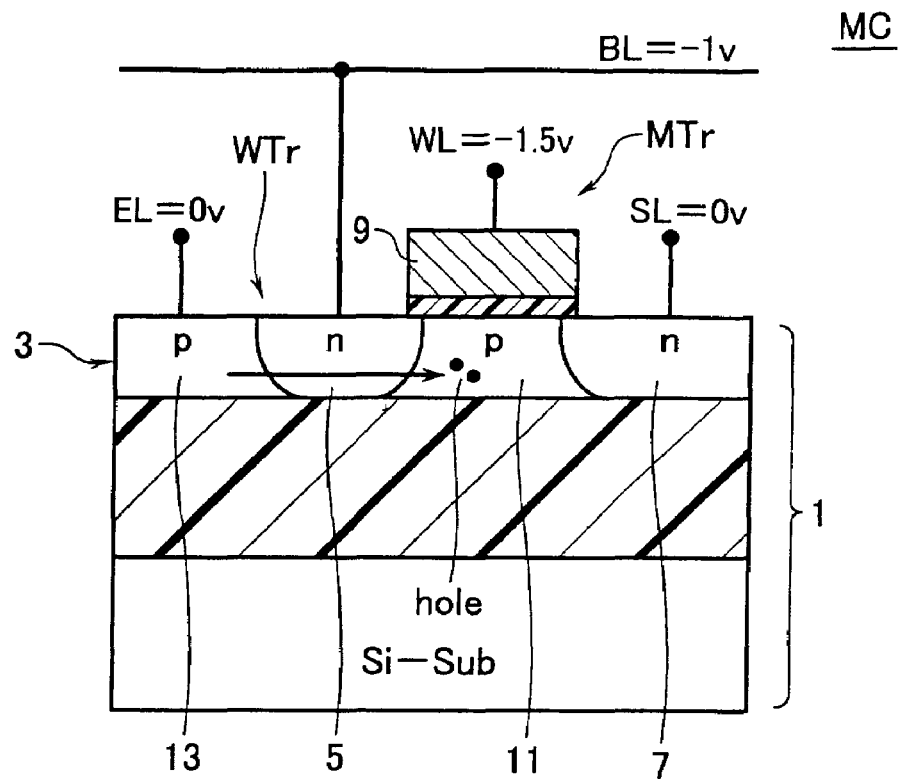
FIG. 5 is a schematic cross-sectional view of a memory cell according to a second comparative example.
Figure 6:
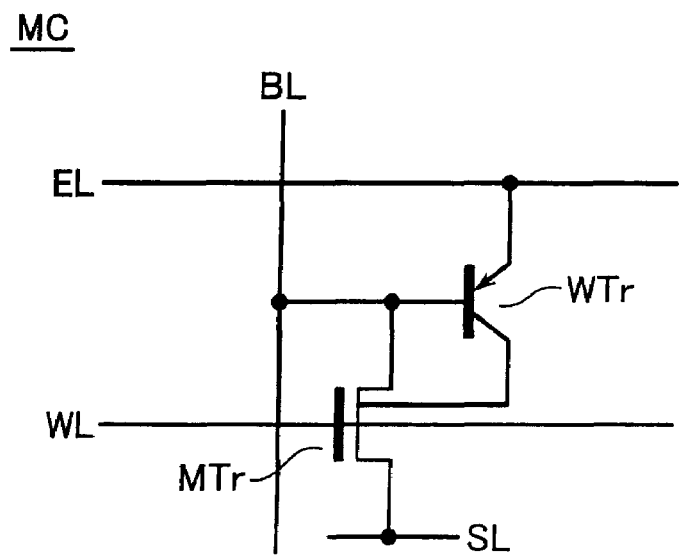
FIG. 6 is an equivalent circuit diagram of the same memory cell.

FIG. 5 is a schematic cross-sectional view of a memory cell MC according to a second comparative example. FIG. 6 shows an equivalent circuit diagram thereof. This memory cell MC comprises a write transistor WTr for data writing in addition to the memory transistor MTr shown in FIG. 1. The transistor WTr is a parasitic bipolar transistor. In detail, the transistor WTr has a p-type emitter region 13, which is so formed in the semiconductor layer 3 that the n-type drain region 5 locates between the region 13 and the channel body 11. The transistor WTr employs the drain region 5 as an n-type base region and the channel body 11 as a p-type collector region.

In the memory cell MC, the gate electrode 9 is connected to the word line WL, the drain region 5 to the bit line BL that crosses the word line WL, and the source region 7 to the source line SL. The emitter region 13 is connected to an emitter line EL that extends in parallel with the word line WL.

Similar to the first comparative example, the memory cell MC of the second comparative example dynamically stores the first data state ("1" data) that holds excess majority carriers (holes) in the channel body 11 of the memory transistor MTr and the second data state ("0" data) that holds less excess majority carriers. FIG. 5 shows an exemplary bias for writing "1" to the memory cell MC. On "1" write, −1.5 V is applied to the word line WL, −1 V to the bit line BL, and 0 V to the emitter line EL while the source line SL is kept at 0 V.

In this case, as a PN junction between the p-type emitter region 13 and the n-type drain region 5 (the base-emitter junction in the transistor WTr) is forward biased, holes are injected from the emitter region 13 to the drain region 5. The injected holes partly recombine in the drain region 5 and the remains reach the p-type channel body 11. In other words, "1" write is an operation to inject holes into the channel body 11 of the memory transistor MTr by on-operation of the bipolar transistor or the write transistor WTr. Hereinafter, this write is referred to as "bipolar write".

Bipolar write can easily increase a current flowing in the channel body 11 (collector current) to achieve quick "1" write by adjusting a voltage across the emitter line EL and the bit line BL.

"0" write is performed in the same manner as in the first comparative example with 1.5 V applied to the word line WL to elevate the potential on the channel body 11 and −2 V to the bit lie BL while keeping the write transistor WTr off. As a result, a forward bias is applied across the channel body 11 and the drain region 5 to release holes from inside the channel body 11 to the drain region 5 to write "0" data with less excess holes. The memory cell MC of the second comparative example is also required to refresh data at a certain cycle because it stores data "0" or "1" dynamically.

Structure of Memory Cell in First Embodiment

Figure 7:
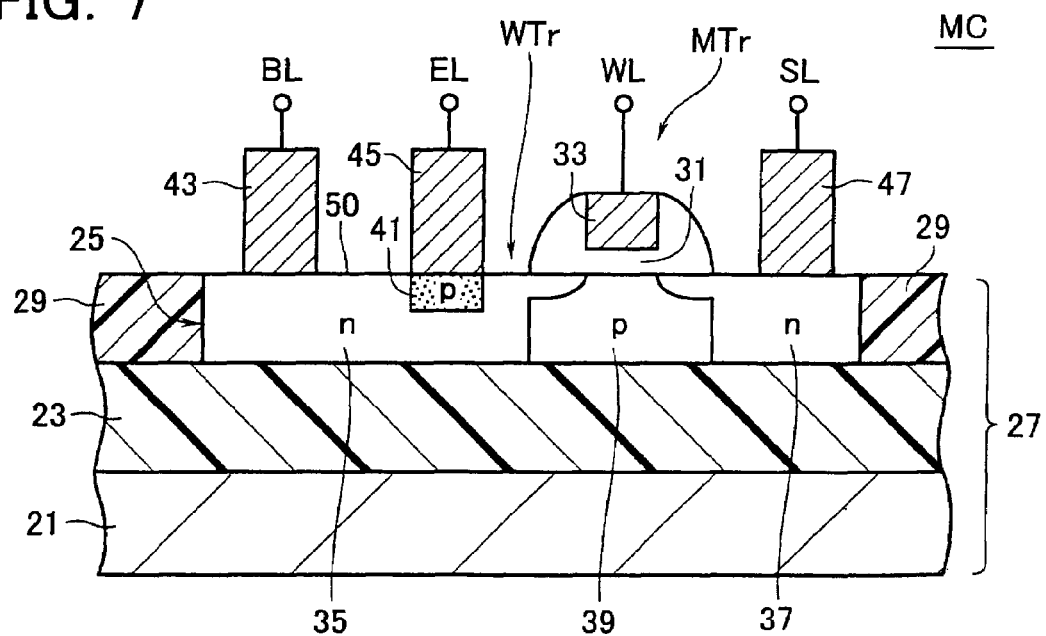
FIG. 7 is a schematic diagram briefly showing a memory cell according to a first embodiment.

The memory cell according to the first embodiment can achieve much quicker write in the same write operation as the second comparative example because the impurity concentration in the emitter region can be increased higher than the second comparative example. FIG. 7 is a schematic diagram briefly showing the memory cell according to the first embodiment. The memory cell MC comprises a set of the memory transistor MTr and the write transistor WTr similar to the second comparative example.

The memory transistor MTr is an NMOS transistor that has a floating body. The write transistor WTr is a bipolar transistor that employs the floating body as a collector. These transistors are formed on a SOI substrate 27 having a stacked structure that includes a silicon substrate 21 (an example of the substrate), a silicon oxide layer 23 (an example of the insulator layer), and a p-type single crystalline silicon layer 25 (an example of the semiconductor layer of the first conductive type). The silicon layer 25 is isolated from the silicon substrate 21 by the silicon oxide layer 23. A device isolation layer 29 is formed to surround the silicon layer 25.

The memory transistor MTr has a gate electrode 33 disposed on the silicon layer 25 via a gate insulator film 31, and n-type (an example of the first conductive type) regions of a drain 35 and a source 37 self-aligned with the gate electrode and formed in the silicon layer 25. A p-type channel body 39 is formed in the silicon layer 25 between these regions immediately beneath the gate electrode 33. The channel body 39 is a floating body. Similar to the first and second comparative examples, the memory transistor MTr stores data as a state of majority carriers accumulated in the channel body 39. In detail, it stores either a first data state that holds excess majority carriers in the channel body 39 or a second data state that holds excess majority carriers less than the first data state in the channel body 39.

An impurity-diffused region 41 of p-type (an example of the first conductive type) is formed at a location, in contact with the upper surface of the drain region 35, close to the gate electrode 33. In detail, the impurity-diffused region 41 is formed in the drain region 35 shallower than the drain region 35. The write transistor WTr is a PNP bipolar transistor that has the p-type impurity-diffused region 41 as an emitter region, the n-type drain region 35 as a base region, and the p-type channel body 39 as a collector. It is employed to write data in the memory transistor MTr.

The impurity-diffused region 41 (emitter region) is shallower than the drain region 35 (base region). Specifically, the impurity-diffused region 41 has a depth of 20-30 nm, and the drain region 35 a depth of 50-150 nm. The impurity-diffused region 41 (emitter region) has a p-type impurity concentration higher than an n-type impurity concentration of $1\times10^{19}/cm^3$ in the drain region 35 (base region). For example, it ranges from $1\times10^{20}/cm^3$ to $1\times10^{21}/cm^3$.

On the drain region 35 between the device isolation film 29 and the impurity-diffused region 41, a conductive drain plug 43 (contact plug) to be connected to the region 35 is formed. This plug 43 is composed of polysilicon that contains an n-type impurity.

On the impurity-diffused region 41 (emitter region), a conductive emitter plug 45 to be connected to the region 41 is formed. The emitter plug 45 is composed of polysilicon that contains a p-type impurity, which is diffused into the drain region 35 to form the impurity-diffused region 41.

On the source region 37, a conductive source plug 47 to be connected to the region 37 is formed. The plug 47 is composed of n-type polysilicon. The source plug 47, the gate electrode 33, the emitter plug 45 and the drain plug 43 are aligned in this order.

Figure 8:
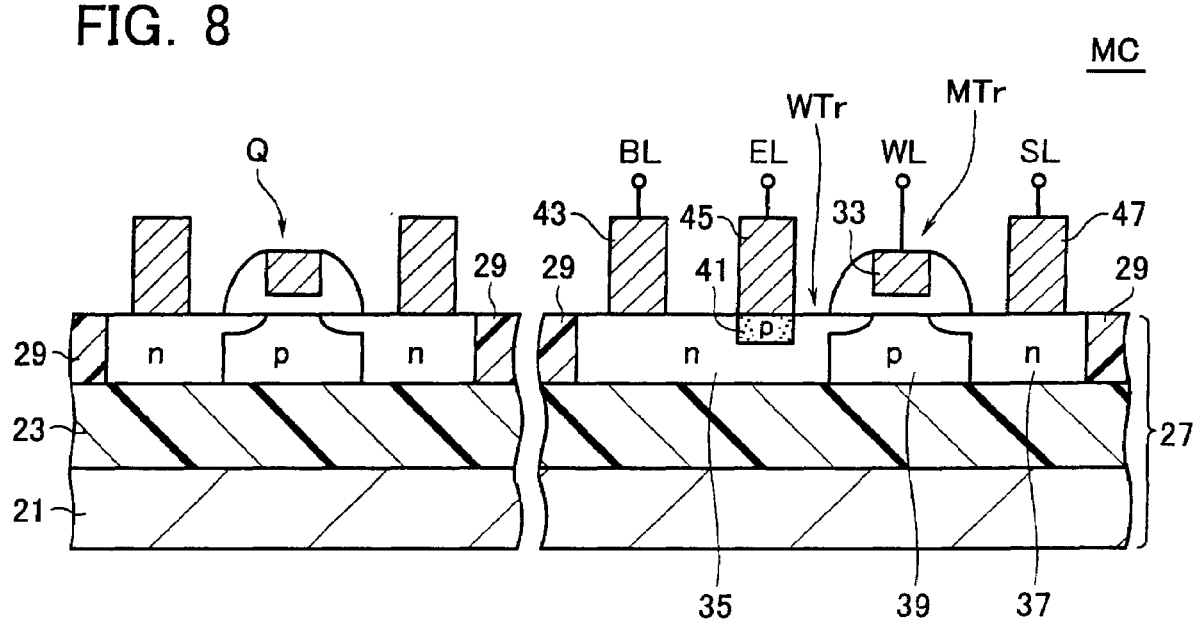
FIG. 8 is a schematic cross-sectional view of transistors configuring the same memory cell and a peripheral circuit.

A cell array is arranged on the SOI substrate 27, including a plurality of memory cells MC arrayed (a structure of the cell array is described later). A peripheral circuit such as a bit line selector is also formed on the SOI substrate 27 as shown in a cross-sectional view of FIG. 8. The memory cell MC has the same section as shown in FIG. 7. In a peripheral circuit region on the SOI substrate 27, an NMOS transistor Q or a component in the peripheral circuit can be seen.

Main Effects of First Embodiment

Figure 9:
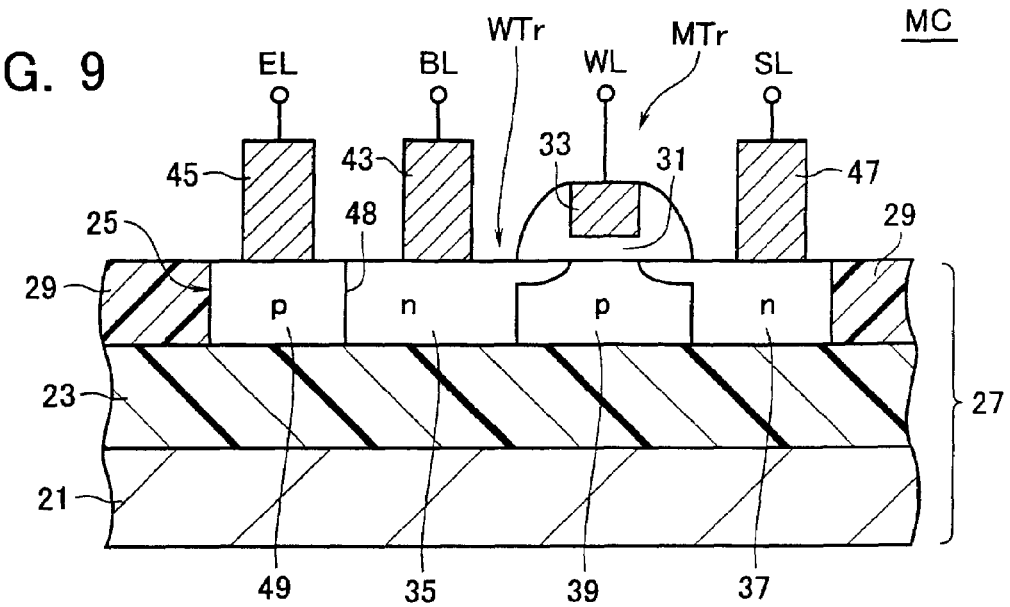
FIG. 9 is a schematic diagram of the major part of the memory cell according to the second comparative example.

Main effects of the first embodiment are described in comparison with the second comparative example. FIG. 9 is a schematic diagram of the major part of the memory cell according to the second comparative example, which corresponds to FIG. 7. FIG. 9 differs from FIG. 7 mainly in the following. The p-type silicon layer 25 between the device isolation film 29 and the drain region 35 is employed as an emitter region 49, which has a p-type impurity concentration of $1\times10^{17}/cm^3$. The drain plug 43 and the emitter region 49 are aligned in reverse order.

A high-concentration emitter region has an increased hFE (the current amplification factor of a bipolar transistor), which increases the write current and results in much quicker bipolar write. In the second comparative example of FIG. 9, however, the emitter region 49 can not have a higher p-type impurity concentration than the n-type impurity concentration in the drain region 35. This reason is described below.

In the structure of the second comparative example the emitter region 49 forms a junction with the drain region 35 (base region) at the side 48 of the drain region 35 using the p-type silicon layer 25 as the emitter region 49. The memory transistor MTr has an NMOS structure including the n-type regions of the drain 35 and the source 37 formed in the p-type silicon layer 25. Operation of the NMOS requires the p-type impurity concentration in the silicon layer 25 being lower than the n-type impurity concentration in the regions of the drain 35 and the source 37. For example, if the n-type impurity concentration in the regions of the drain 35 and the source 37 is equal to $1\times10^{19}/cm^3$, the p-type impurity concentration in the silicon layer 25 is equal to $1\times10^{17}/cm^3$. In this case, the p-type impurity concentration in the emitter region 49 comes to $1\times10^{17}/cm^3$. Accordingly, in the second comparative example the p-type impurity concentration in the emitter region 49 is lower than the n-type impurity concentration in the drain region 35 (base region). Thus, the write transistor WTr has an hFE equal to or below 1 (one), which is lower than that of a normal bipolar transistor.

To the contrary, in the first embodiment shown in FIG. 7, the p-type impurity-diffused region 41 serving as the emitter region is formed at the location in contact with the drain region 35. Therefore, without such the restriction as the second comparative example has, the p-type impurity concentration in the impurity-diffused region 41 can be controlled higher than the n-type impurity concentration in the drain region 35. Thus, the write transistor WTr can be designed to have an hFE more than 1 (one), which enables much quicker write. For example, in the first embodiment the p-type impurity concentration in the emitter region is at least double-digit larger than the second comparative example. It results in an at least double-digit larger emitter current, which achieves quicker write to the memory transistor MTr.

The impurity-diffused region 41 may be located closer to the device isolation film 29 rather than to the gate electrode 33 while locating the emitter plug 45 outward together. The above effect can be achieved also in such the structure, in which the drain plug 43 is located between the emitter plug 45 and the gate electrode 33.

Method of Manufacturing Memory Cell in First Embodiment

Figure 10:
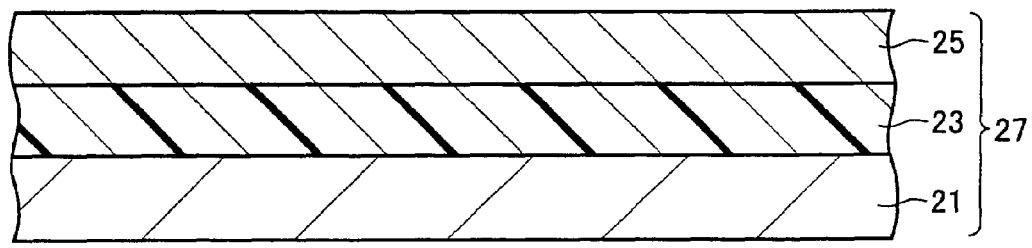
FIG. 10 is a process diagram of a first step in a method of manufacturing the memory cell according to the first embodiment.

A method of manufacturing the memory cell according to the first embodiment is described with reference to FIGS. 10-22, which are cross sectional views of the SOI substrate and others showing the method in order of process steps. First, as shown in FIG. 10, the SOI substrate 27 is prepared. The SOI substrate 27 has a stacked structure including the silicon substrate 21 serving as a support substrate, the silicon oxide layer 23 serving as a buried oxide film, and the p-type silicon layer 25. The silicon layer 25 has a relatively low p-type impurity concentration ($1\times10^{14}/cm^3$).

Figure 11:
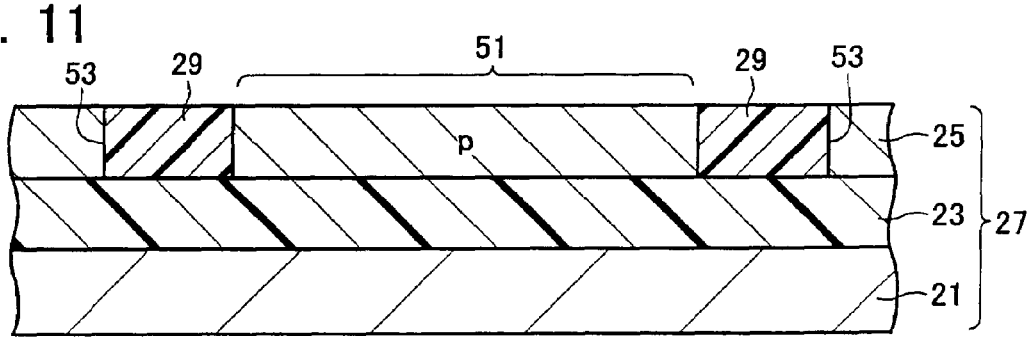
FIG. 11 is a process diagram of a second step in the method.

As shown in FIG. 11, processes of photolithography and reactive ion etching are applied to remove regions other than device formation regions 51 from the silicon layer 25 to form trenches 53. A technology of STI (Shallow Trench Isolation) is applied to form the device isolation film 29 in the trenches 53. Then, ions of a p-type impurity at a slightly higher concentration are implanted into the entire surface of the silicon layer 25 to turn the device formation region 51 to a channel region. In this case, the device formation region 51 has an impurity concentration of $1\times10^{18}/cm^3$. In an exemplary condition for the ion implantation, the p-type impurity is boron (B), and its dose ranges from $1\times10^{13}/cm^2$ to $1.5\times10^{13}/cm^2$.

Figure 12:
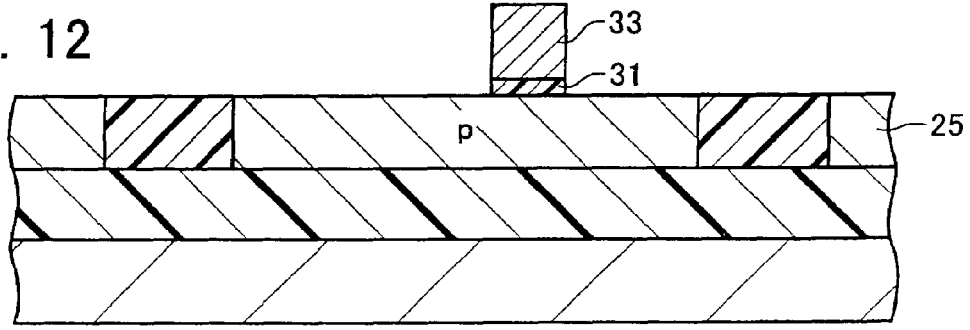
FIG. 12 is a process diagram of a third step in the method.

As shown in FIG. 12, thermal oxidation of the entire surface of the silicon layer 25 forms a thin insulator film serving as the gate insulator film, on which a polysilicon film is formed with a thickness of about 300 nm by CVP (Chemical Vapor Deposition) The polysilicon film and the thin insulator film are patterned by photolithography and reactive ion etching to form the gate electrode 33 and the gate insulator film 31 in the device formation region 51.

Figure 13:
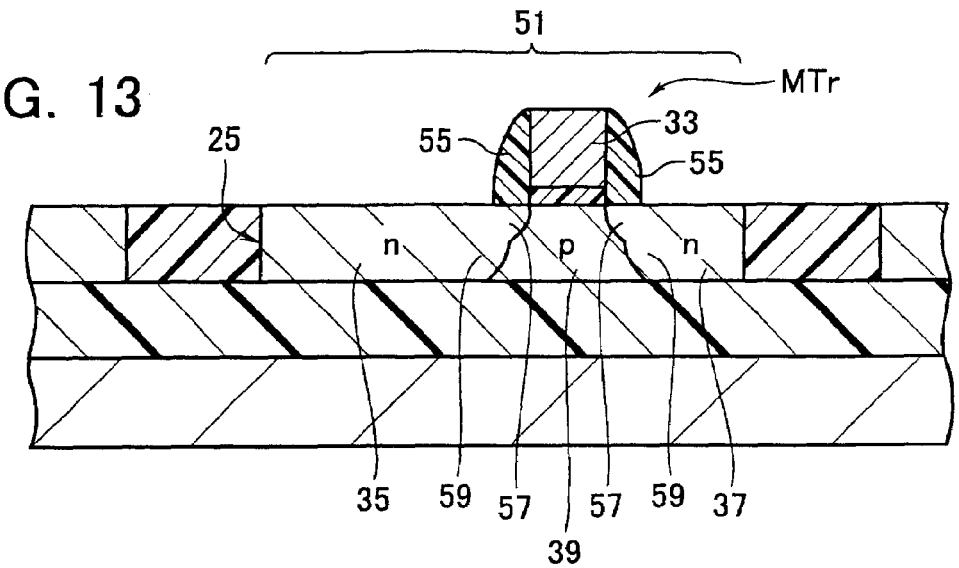
FIG. 13 is a process diagram of a fourth step in the method.

As shown in FIG. 13, ions of an n-type impurity are implanted into the device formation region 51 using a mask of the gate electrode 33 to form an n-type low-concentration region 57 or LDD (Lightly Doped Drain) region. In an exemplary condition for the ion implantation, the n-type impurity is phosphorous (P), and its dose is equal to about $1\times10^{13}/cm^2$. Then, CVD is applied to form a silicon nitride film over the surface of the silicon layer 25. The silicon nitride film is etched by reactive ion etching to form a sidewall nitride film 55 on the side of the gate electrode 33. Ions of an n-type impurity are implanted into the device formation region 51 using a mask of the gate electrode 33 and the sidewall nitride film 55 to form an n-type high-concentration region 59. In an exemplary condition for the ion implantation, the n-type impurity is phosphorous (P), and its dose ranges from $1\times10^{13}/cm^2$ to $2\times10^{13}/cm^2$. The n-type low-concentration region 57 and the n-type high-concentration region 59 form LDD structured regions of the drain 35 and the source 37. The n-type concentration in these regions 35 and 37 is equal to $1\times10^{19}/cm^3$. The above processes form the memory transistor MTr that includes the gate electrode 33, the drain region 35, the source region 37 and the channel body 39.

Figure 14:
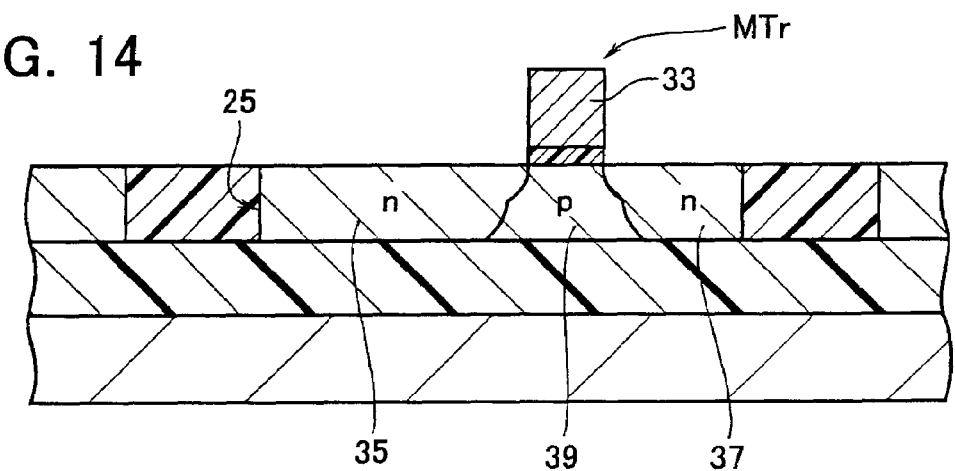
FIG. 14 is a process diagram of a fifth step in the method.

As shown in FIG. 14, the sidewall nitride film 55 is removed by etching (with a heated phosphoric acid, for example). The sidewall nitride film 55 is employed for the MOS transistor in the peripheral circuit. A sidewall nitride film for the memory transistor MTr is formed in a later process.

Figure 15:
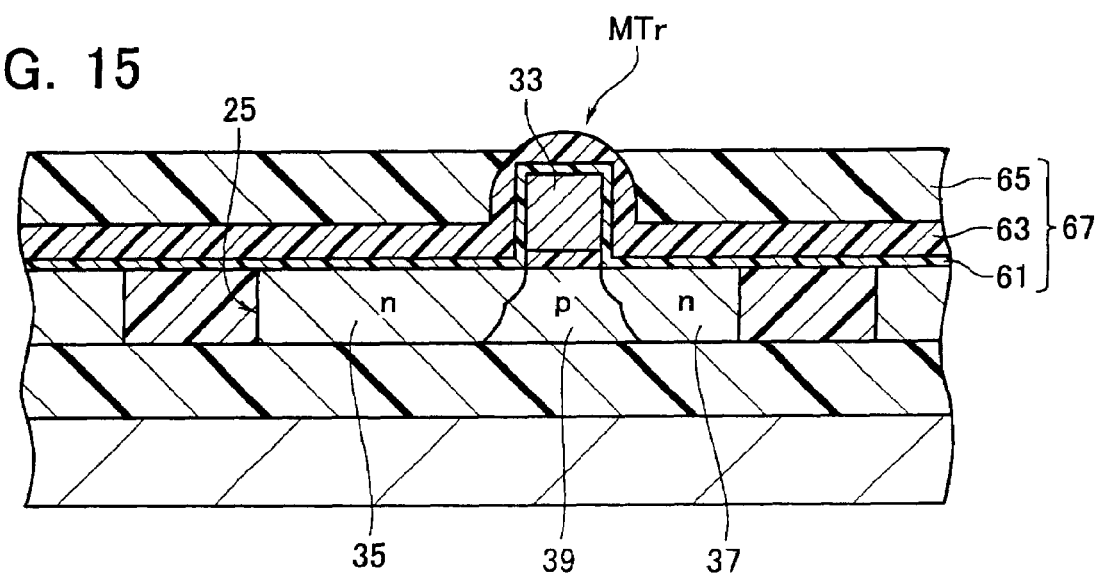
FIG. 15 is a process diagram of a sixth step in the method.

As shown in FIG. 15, LPCVD (Low Pressure Chemical Vapor Deposition) is applied to form a silicon oxide film 61, a silicon nitride film 63, and a relatively thick (300 nm) silicon oxide film 65 over the silicon layer 25 in turn. These layers form an interlayer insulator film 67 that covers the memory transistor MTr. The silicon oxide film 65 is polished to planarize the silicon oxide film 65 so as to expose the silicon nitride film 63 on the gate electrode 33.

Figure 16:
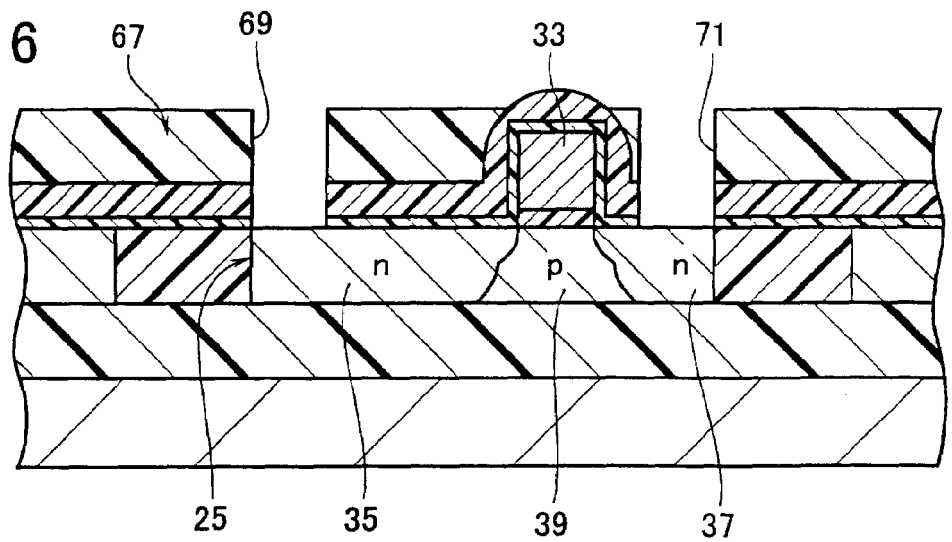
FIG. 16 is a process diagram of a seventh step in the method.

As shown in FIG. 16, processes of photolithography and reactive ion etching are applied to form a drain contact hole 69 to expose the drain region 35 and a source contact hole 71 to expose the source region 37 in the interlayer insulator film 67.

Figure 17:
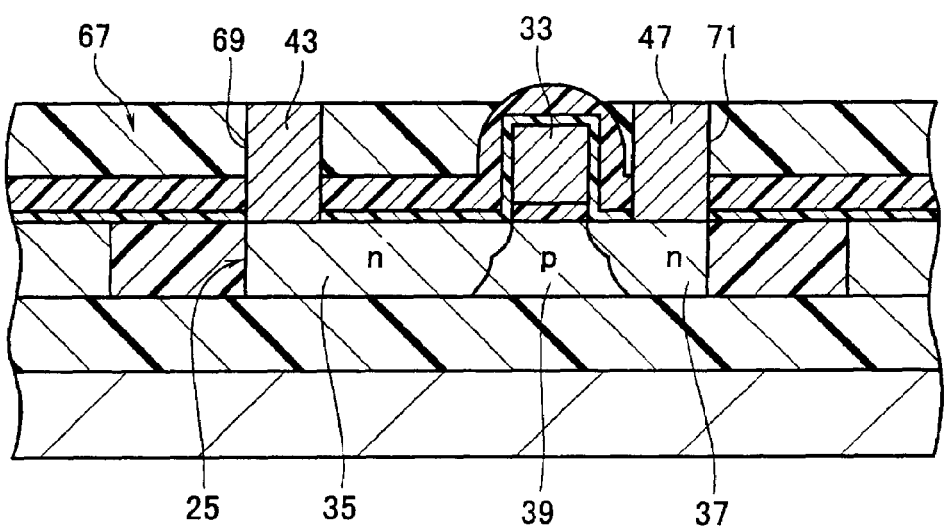
FIG. 17 is a process diagram of an eighth step in the method.

As shown in FIG. 17, an n-type polysilicon film with a thickness of 400 nm is formed over the interlayer insulator film 67 by CVD so as to fill up the contact holes 69 and 71. The polysilicon film is then subjected to reactive ion etching so that the polysilicon film resides in the contact holes 69 and 71. Thus, a drain plug 43 is formed in the drain contact hole 69, a source plug 47 in the source contact hole 71.

Figure 18:
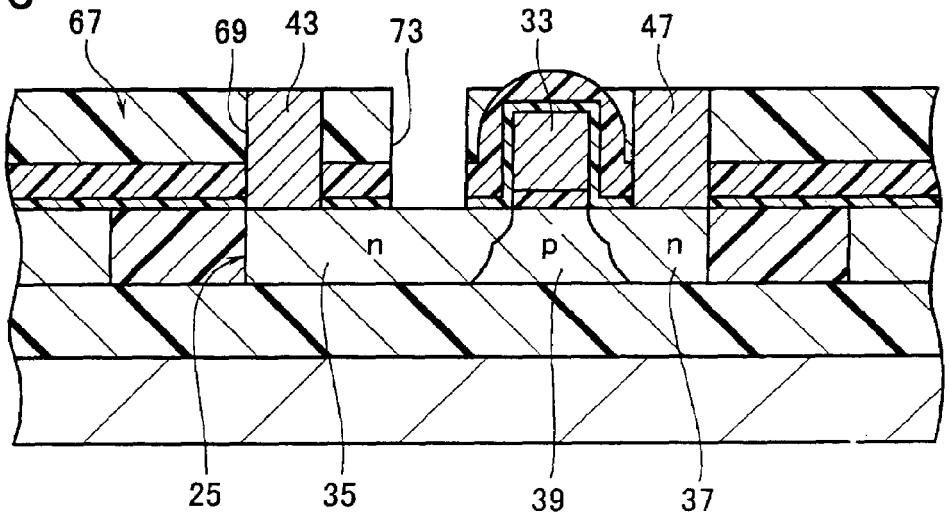
FIG. 18 is a process diagram of a ninth step in the method.

As shown in FIG. 18, processes of photolithography and reactive ion etching are applied to form an emitter contact hole 73 to expose the drain region 35 in the interlayer insulator film 67 between the drain plug 43 and the gate electrode 33.

Figure 19:
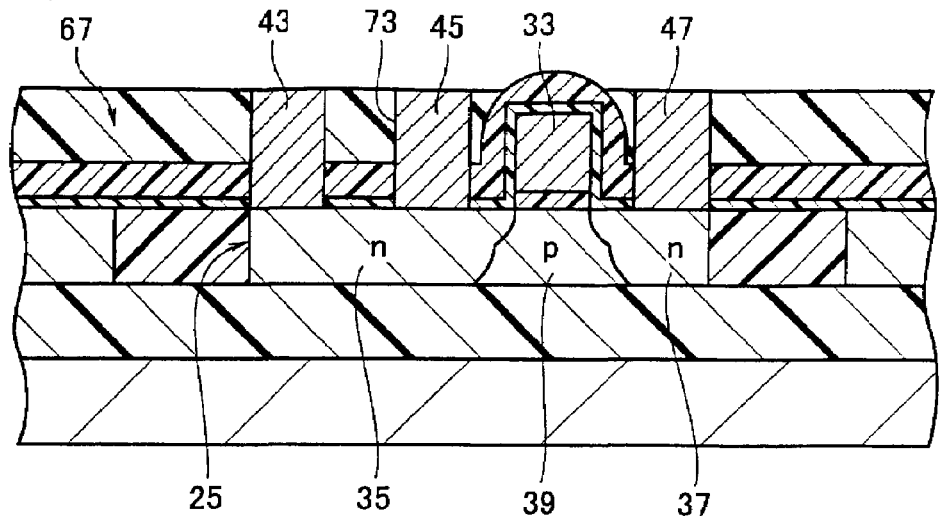
FIG. 19 is a process diagram of a tenth step in the method.

As shown in FIG. 19, a p-type polysilicon film with a thickness of 400 nm to be emitter plugs is formed over the interlayer insulator film 67 by CVD so as to fill up the contact hole 73. The polysilicon film has a p-type impurity concentration of about $1e20/cm^3$. The polysilicon film is then subjected to reactive ion etching such that the polysilicon film resides in the contact hole 73. Thus, an emitter plug 45 is formed in the emitter contact hole 73.

Figure 20:
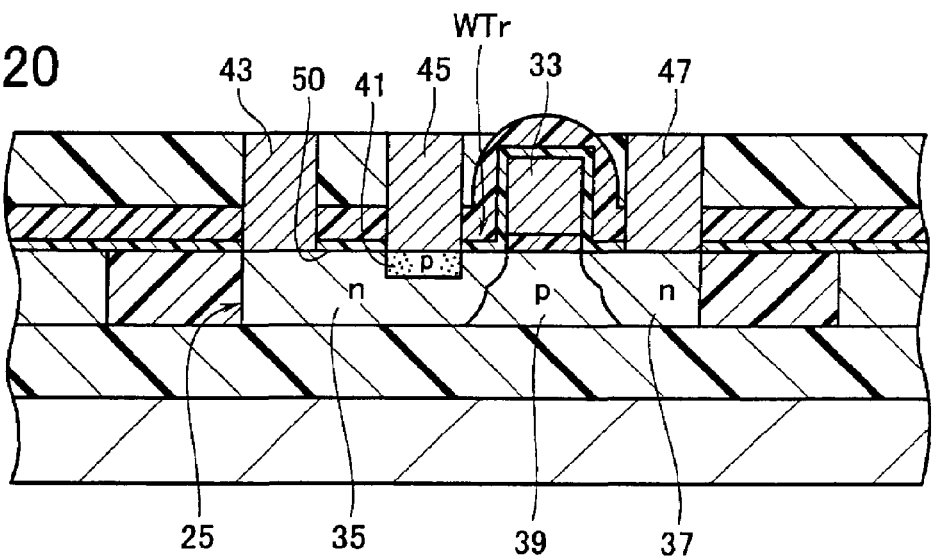
FIG. 20 is a process diagram of an eleventh step in the method.

The structure shown in FIG. 20 is heated at a temperature of 1015° C. for 10 seconds to activate the n-type impurity in the regions of the drain 35 and the source 37. This heating also diffuses the p-type impurity from the p-type emitter plug 45 into the upper surface 50 of the drain region 35. As a result, the p-type impurity-diffused region 41 (emitter region), having a higher p-type impurity concentration than the n-type impurity concentration in the drain region 35, is formed in the upper surface 50 of the drain region 35. Thus, the write transistor WTr or bipolar transistor is formed to have the impurity-diffused region 41 as the emitter region, the drain region 35 as the base region, and the channel body 39 as the collector region.

Figure 21:
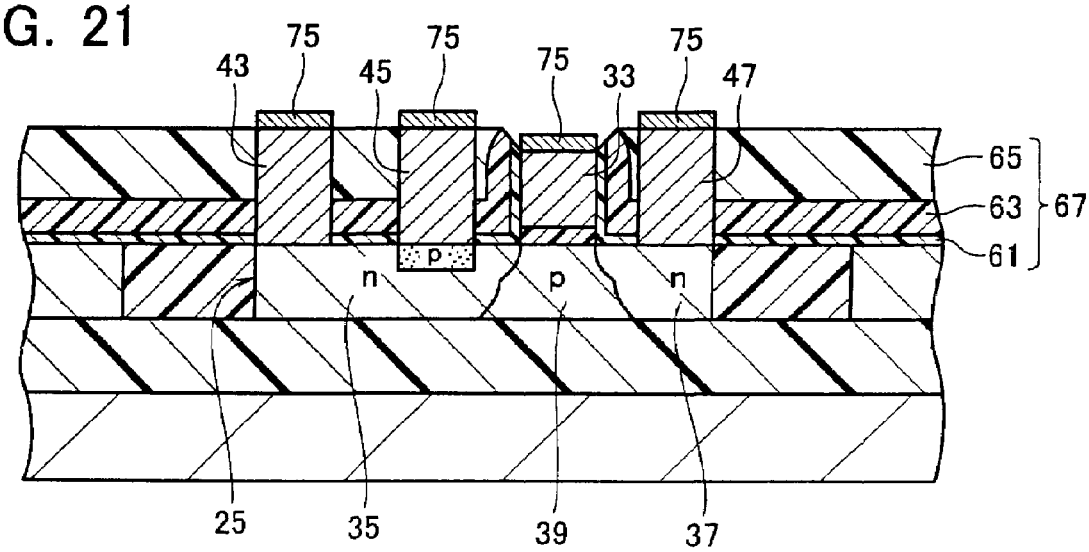
FIG. 21 is a process diagram of a twelfth step in the method.

As shown in FIG. 21, the exposed silicon nitride film 63 and the below-located silicon oxide film 61 are removed by reactive ion etching to expose the upper surface of the gate electrode 33. A titanium film is formed over the interlayer insulator film 67 by spattering. The structure shown in FIG. 21 is heated to cause reaction of the titanium film with silicon in the gate electrode 33, the drain plug 43, the emitter plug 45 and the source plug 47. As a result, a titanium silicide film 75 is formed over the upper surfaces of the gate electrode 33, the drain plug 43, the emitter plug 45 and the source plug 47.

Figure 22:
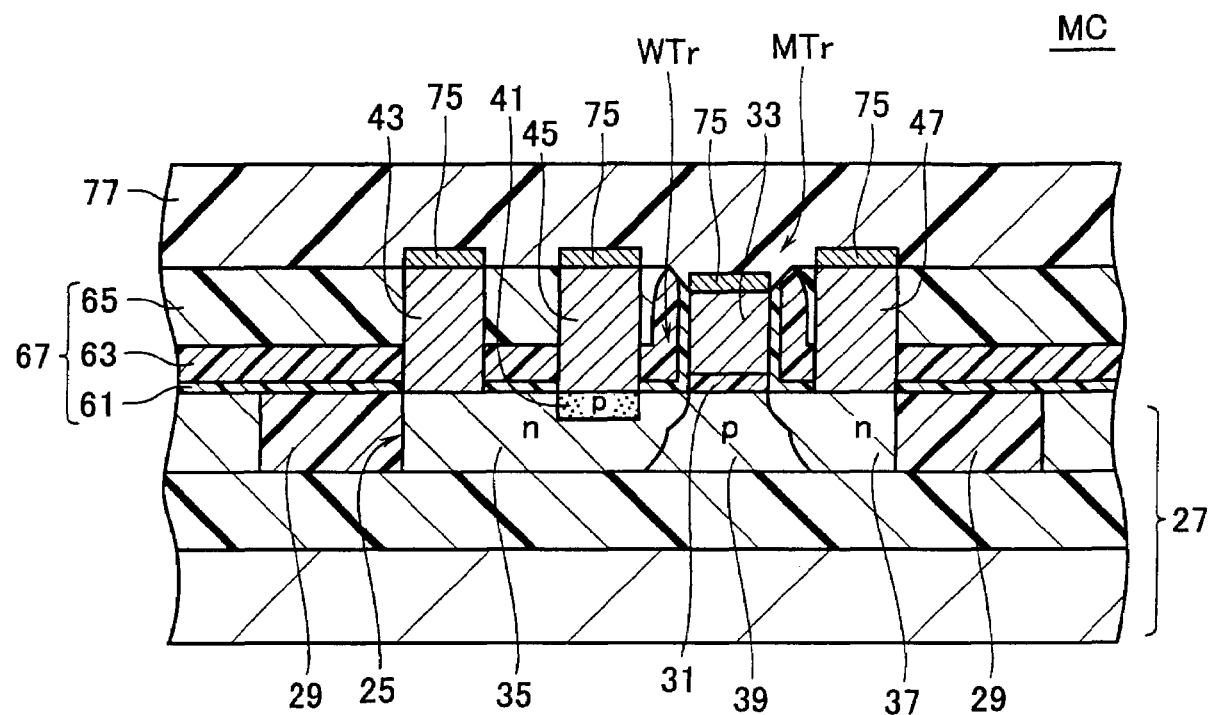
FIG. 22 is a process diagram of a thirteenth step in the method.

As shown in FIG. 22, on the interlayer insulator film 67, a silicon oxide film 77 or an interlayer insulator film with a thickness of 600 nm is formed by LPCVD. Then, plugs, not shown, are formed in the silicon oxide film 77 to connect the drain plug 43 to the bit line BL, the emitter plug 45 to the emitter line EL, and the source plug 47 to the source line SL, respectively. Through the above processes, the memory cell according to the first embodiment can be produced.

As shown in FIGS. 18 and 19, the emitter contact hole 73 is formed closer to the gate electrode 33 rather than to the drain contact hole 69 to form the emitter plug 45 closer to the gate electrode 33 rather than to the drain plug 43. Alternatively, they may be aligned in reverse order. In a word, the drain contact hole 69 is formed closer to the gate electrode 33 rather than to the emitter contact hole 73 to form the drain plug 43 closer to the gate electrode 33 rather than to the emitter plug 45.

The emitter plug 45 is formed after formation of the drain plug 43 and the source plug 47 while they may be formed in reverse order.

Cell Array in First Embodiment

Figure 23:
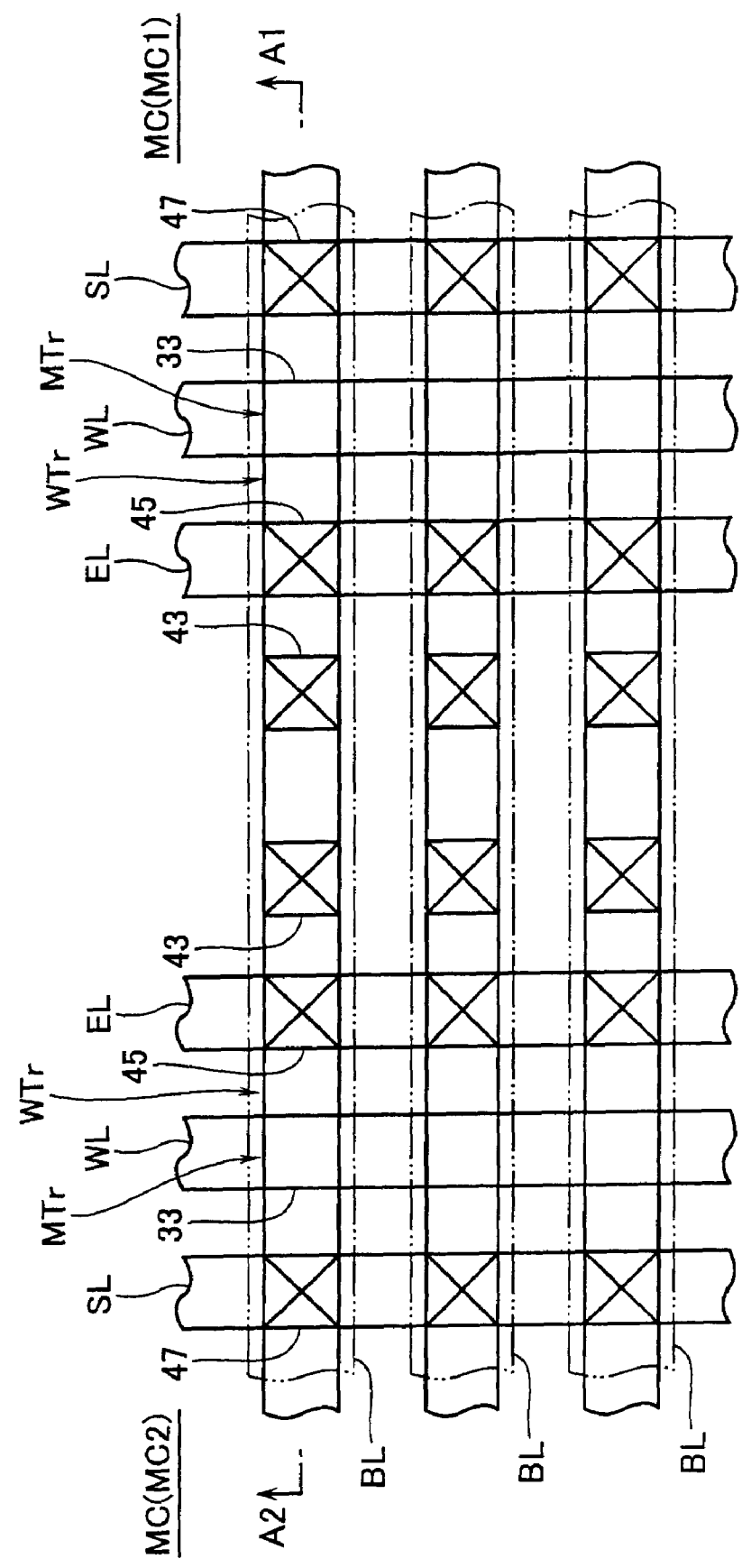
FIG. 23 is a plan view showing a layout of part of a cell array according to the first embodiment.
Figure 24:
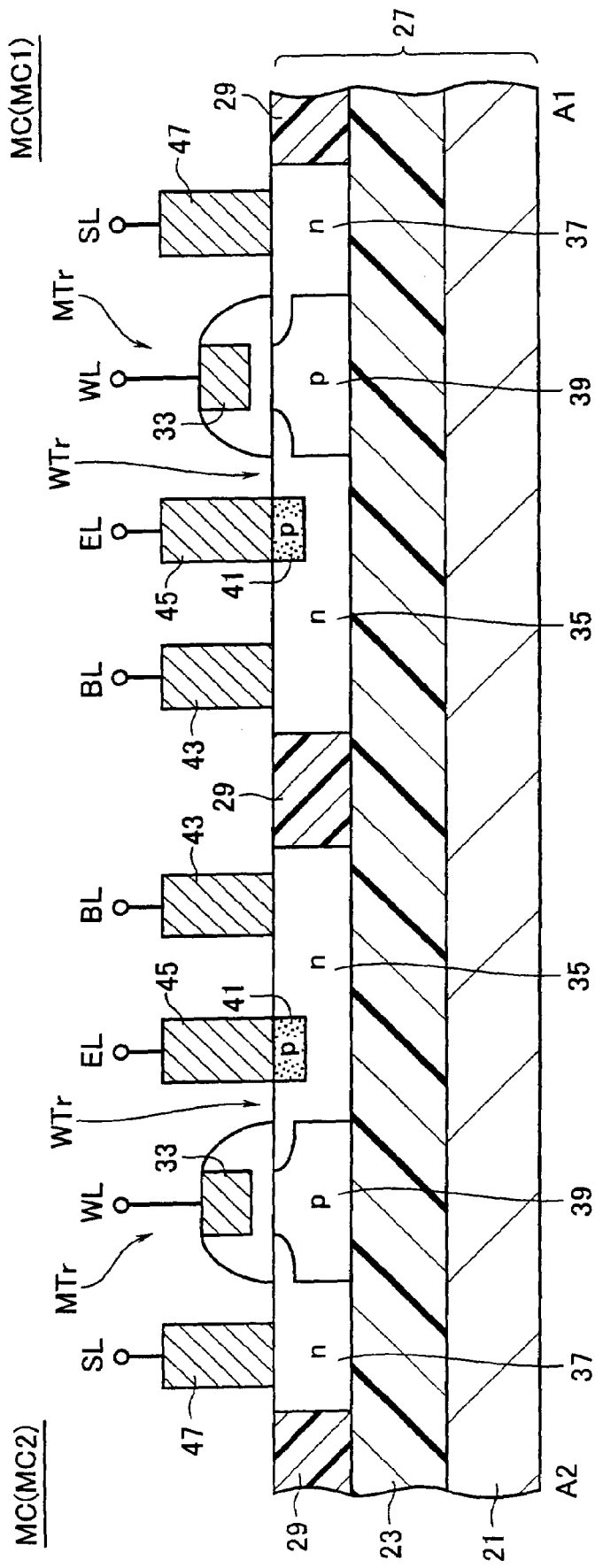
FIG. 24 is a schematic diagram of A1-A2 section in FIG. 23.

FIG. 23 is a plan view showing a layout of part of a cell array according to the first embodiment. FIG. 24 is a schematic diagram of A1-A2 section in FIG. 23. A structure of the cell array is described with reference to FIGS. 23 and 24. The source line SL, the word line WL and the emitter line EL extend in the same direction. The source line SL is connected to the source plug 47, and the emitter line EL to the emitter plug 45. Extending in the direction orthogonal to these lines, the bit line BL is connected to the drain plug 43. The cell array is structured to include a plurality of arrayed memory cells MC. In detail, the memory cells MC are arrayed in matrix at intersections of the word lines WL and the bit lines BL.

FIG. 24 shows two adjacent memory cells MC1 and MC2. The memory cell MC1 has the same section as that of the memory cell shown in FIG. 7. The memory cell MC2 has a sectional structure in which the section of the memory cell MC1 is folded back about the device isolation film 29 located between the memory cell MC1 and the memory cell MC2. In a word, a mirror image relation is found in the sections of the memory cell MC1 and the memory cell MC2. Accordingly, the source plug 47, the gate electrode 33, the emitter plug 45 and the drain plug 43 in the memory cell MC1, and the drain plug 43, the emitter plug 45, the gate electrode 33 and the source plug 47 in the memory cell MC2 are aligned in this order.

The mirror image relation is also found in the plains of the memory cell MC1 and the memory cell MC2. Accordingly, the source line SL, the word line WL and the emitter line EL in the memory cell MC1, and the emitter line EL, the word line WL and the source line SL in the memory cell MC2 are aligned in this order.

Second Embodiment

Figure 25:
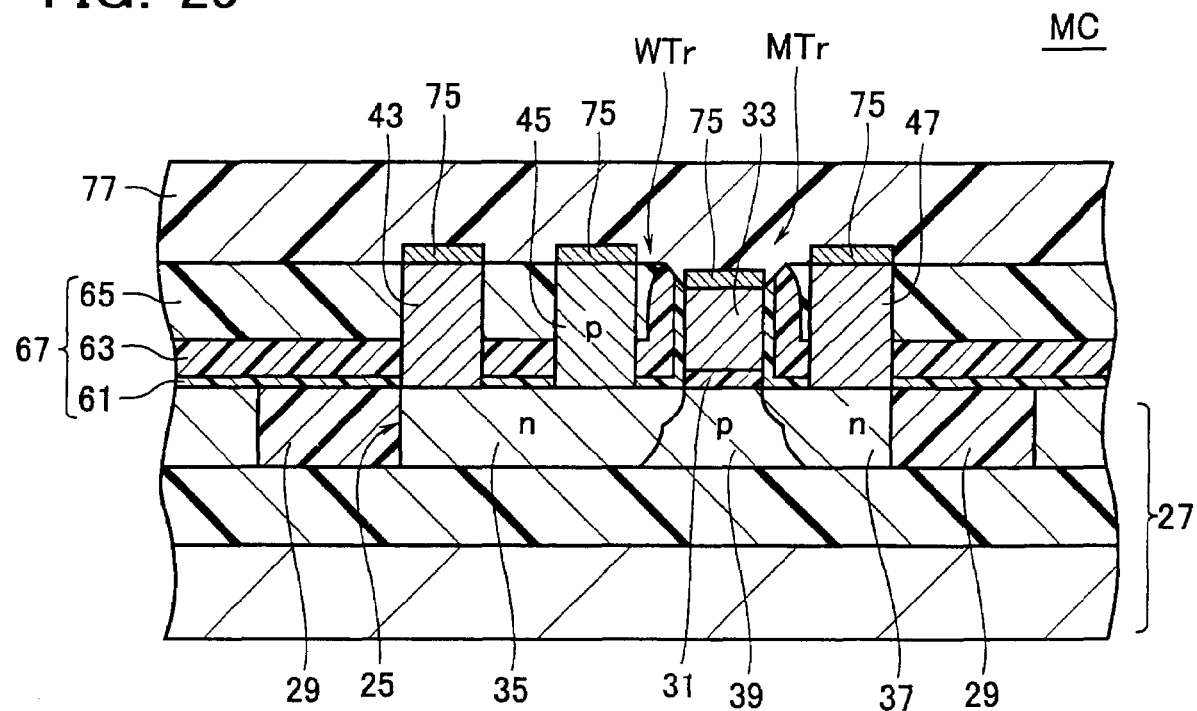
FIG. 25 is a schematic cross-sectional view of a memory cell according to a second embodiment.

A second embodiment is describe with reference to FIG. 25, which is a schematic cross-sectional view of a memory cell MC according to the second embodiment. In this embodiment, the emitter plug 45 has a p-type single crystalline structure, which is employed as an emitter region or impurity-diffused region.

The emitter plug 45 has a p-type impurity concentration (between $1\times10^{20}/cm^3$ and $1\times10^{21}/cm^3$), which is controlled higher than an n-type impurity concentration ($1\times10^{19}/cm^3$) in the drain region 35. Therefore, the second embodiment can achieve the same effect as that of the first embodiment.

In the memory cell according to the second embodiment, after the process steps described in the first embodiment with reference to FIGS. 10-18, the emitter plug 45 is formed in the emitter contact hole 73 shown in FIG. 18 by selective epitaxial growth while doping a p-type impurity. A condition for this selective epitaxial growth is described briefly as follows. A gas of $SiH_4+B_2H_6$ is employed under pressure of 10 Torr at a temperature of 700° C.

In this selective epitaxial growth, such the p-type impurity-diffused region 41 as in the first embodiment is hardly formed in the drain region 35. Thus, in the second embodiment the p-type impurity-diffused region 41 is not located in the current path of the memory transistor MTr. Therefore, it is possible to reduce the source-drain resistance in the memory transistor MTr lower than the first embodiment.

Third Embodiment

Figure 26:
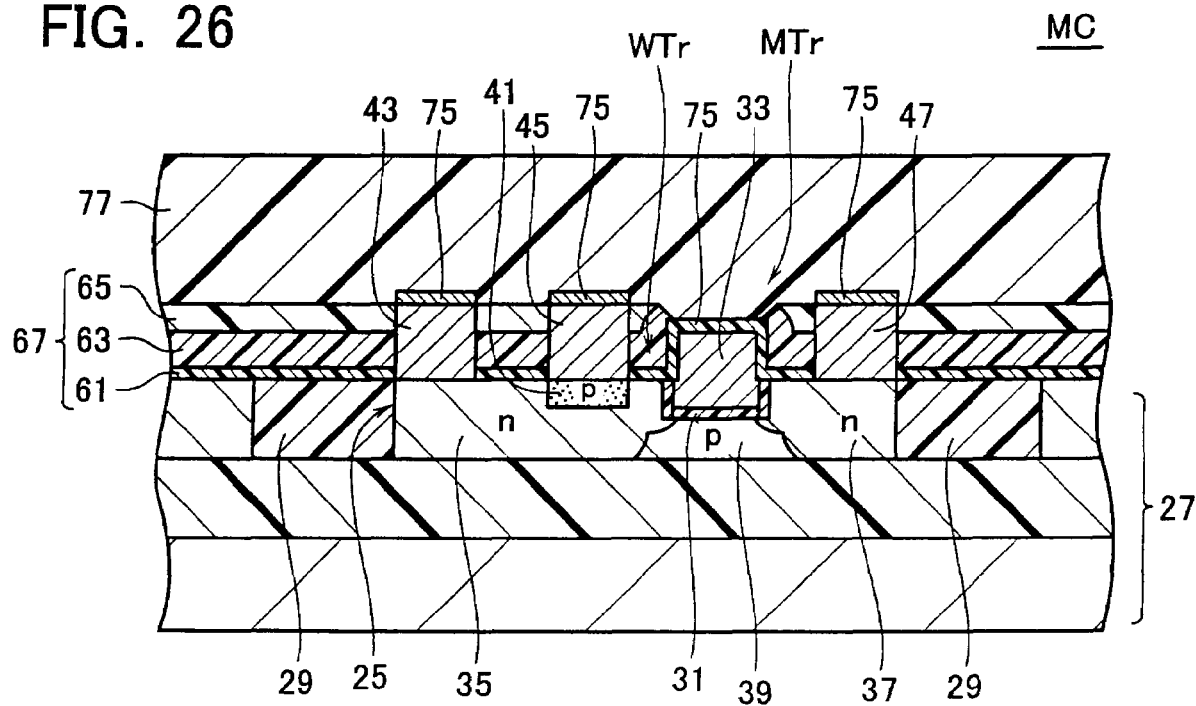
FIG. 26 is a schematic cross-sectional view of a memory cell according to a third embodiment.

FIG. 26 is a schematic cross-sectional view of a memory cell according to a third embodiment, which correspond to FIG. 22 in the first embodiment. The third embodiment differs from the first embodiment shown in FIG. 22 in the gate electrode 33 that is partly buried in the silicon layer 25. Therefore, the memory transistor MTr has a recess channel structure, which has a below-described effect.

In the first embodiment shown in FIG. 22, the p-type impurity-diffused region 41 is located in the current path of the memory transistor MTr. To the contrary, in the third embodiment shown in FIG. 26, the current path of the memory transistor MTr is located beneath the impurity-diffused region 41 though the p-type impurity-diffused region 41 is formed in the drain region 35 because the memory transistor MTr has the recess channel structure. Accordingly, the source-drain resistance can be lowered.

Thus, the memory cell according to the third embodiment has an effect capable of lowering the source-drain resistance in addition to the same effect as that of the first embodiment capable of achieving quick write using the high-concentration emitter region (the impurity-diffused region 41).

Figure 27:
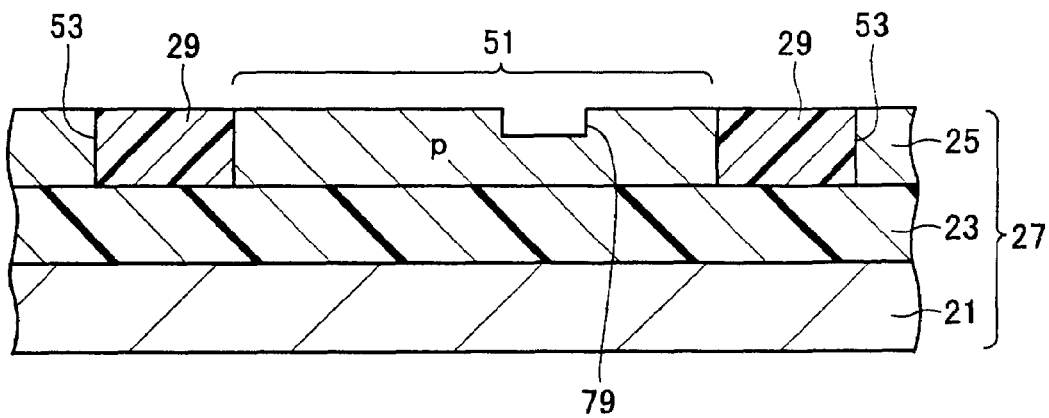
FIG. 27 is a process diagram of a first step in a method of manufacturing the memory cell according to the third embodiment.

A method of manufacturing the memory cell according to the third embodiment is described with reference to FIGS. 27-37, which are cross sectional views of the SOI substrate and others showing the method in order of process steps. First, after the process steps of FIGS. 10 and 11 described in the first embodiment, as shown in FIG. 27, processes of photolithography and reactive ion etching are applied to recess a gate electrode formation region 79 in the device formation region 51 to form a recess therein. The depth of the recess is almost half the silicon layer 25.

Figure 28:
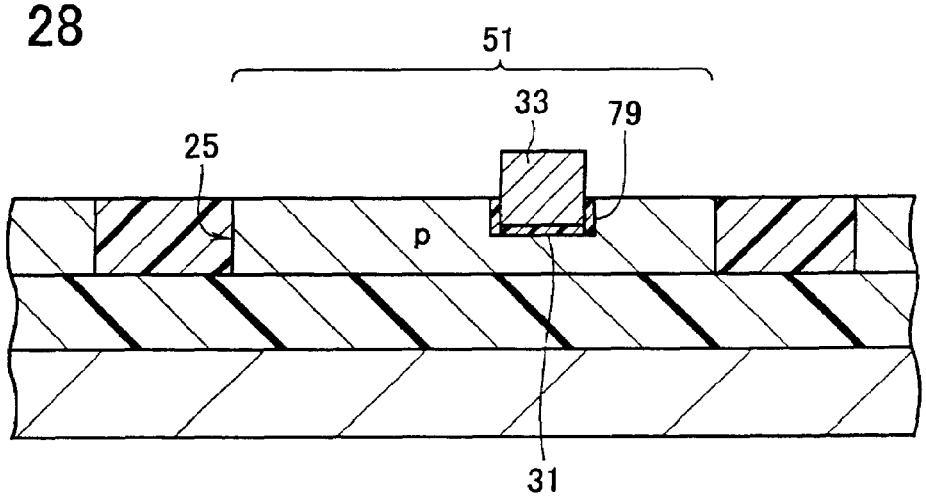
FIG. 28 is a process diagram of a second step in the method.
Figure 29:
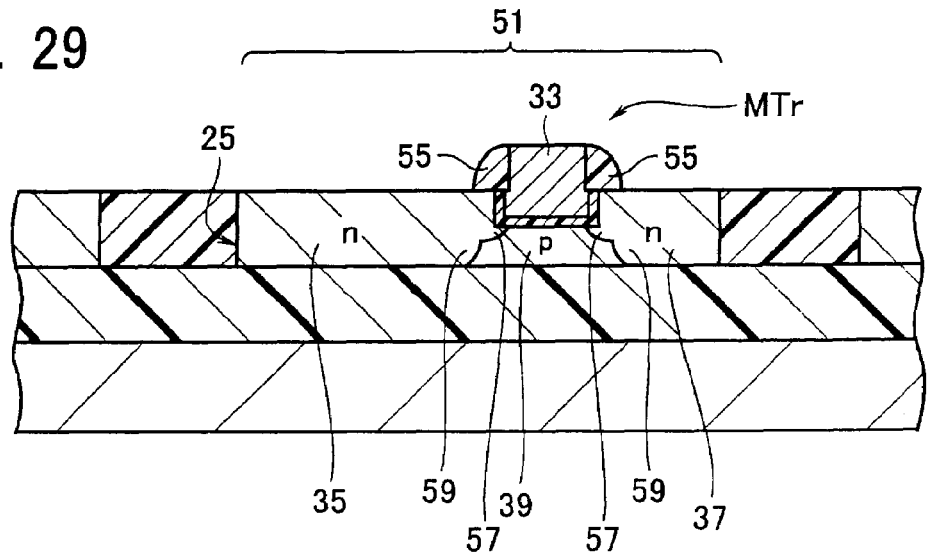
FIG. 29 is a process diagram of a third step in the method.
Figure 30:
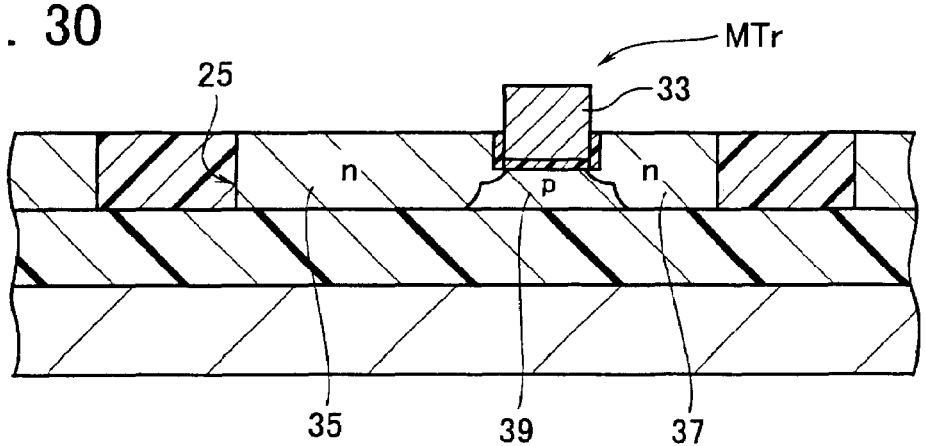
FIG. 30 is a process diagram of a fourth step in the method.
Figure 31:
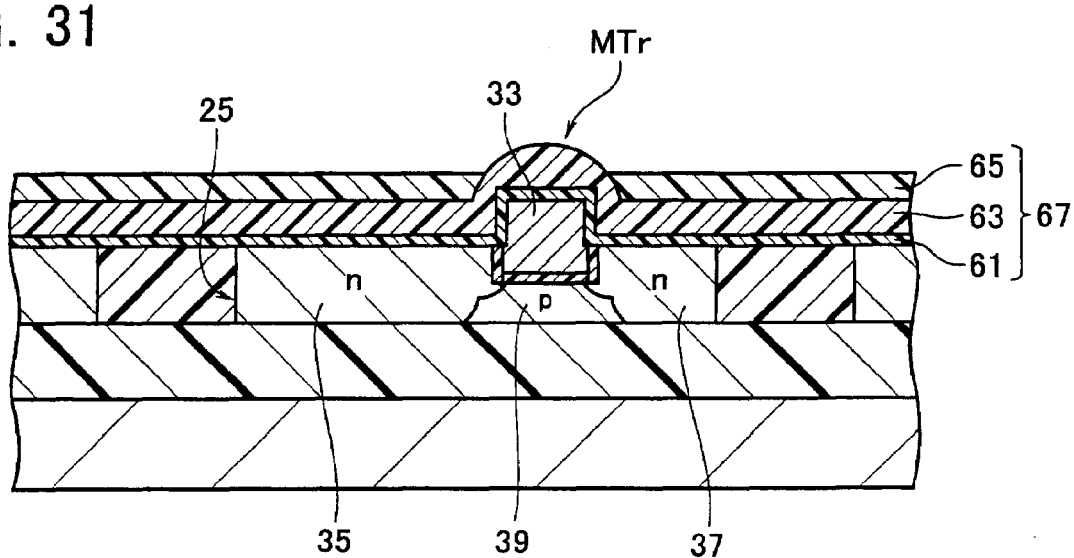
FIG. 31 is a process diagram of a fifth step in the method.
Figure 32:
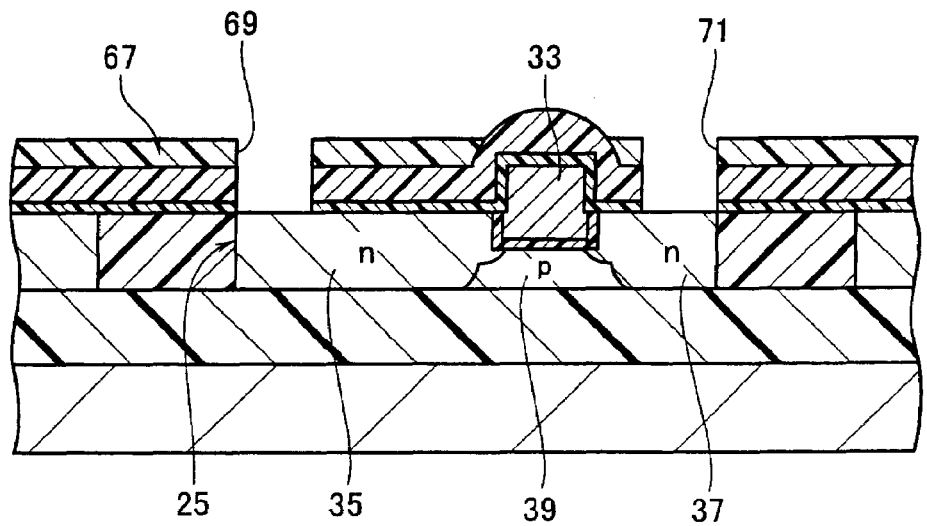
FIG. 32 is a process diagram of a sixth step in the method.
Figure 33:
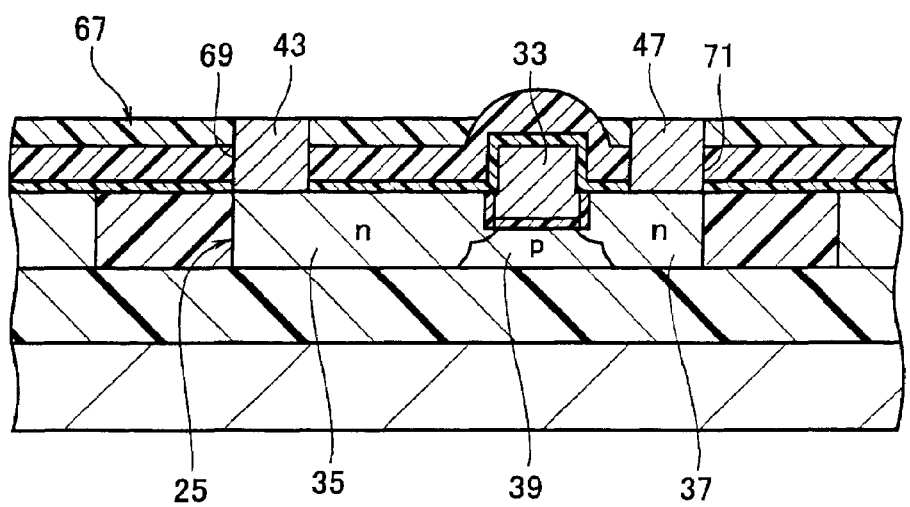
FIG. 33 is a process diagram of a seventh step in the method.
Figure 34:
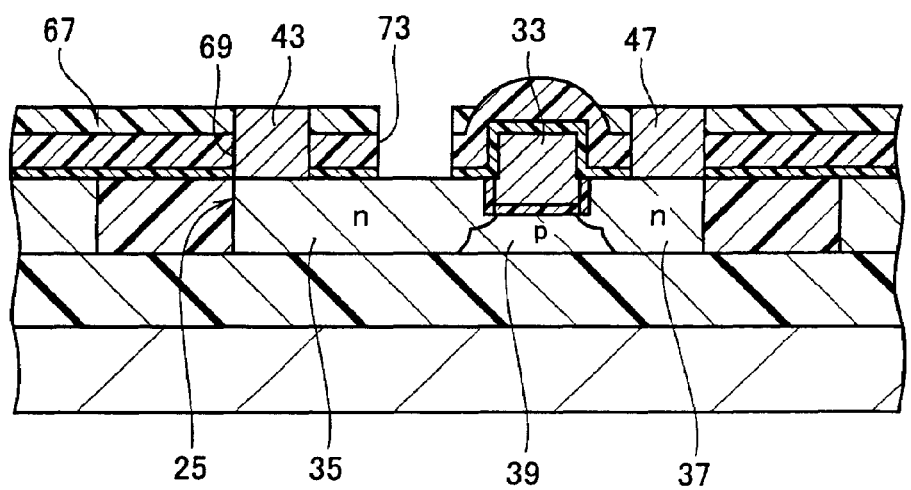
FIG. 34 is a process diagram of an eighth step in the method.
Figure 35:
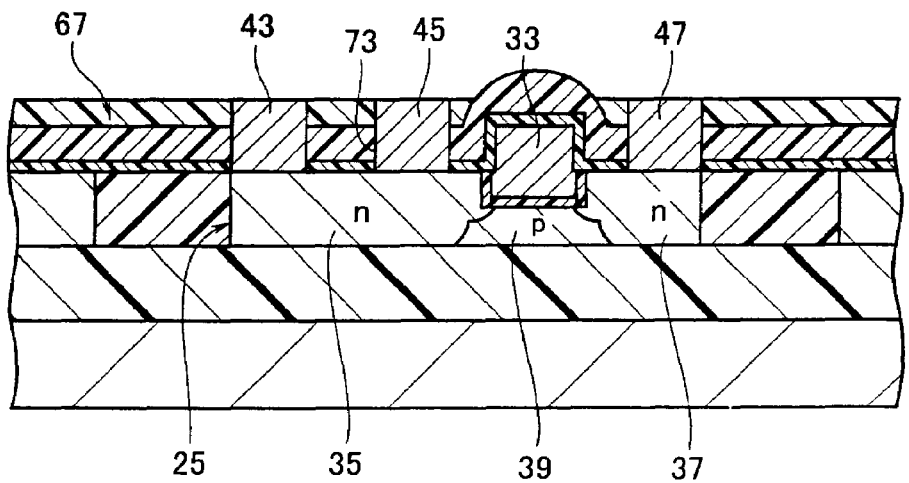
FIG. 35 is a process diagram of a ninth step in the method.
Figure 36:
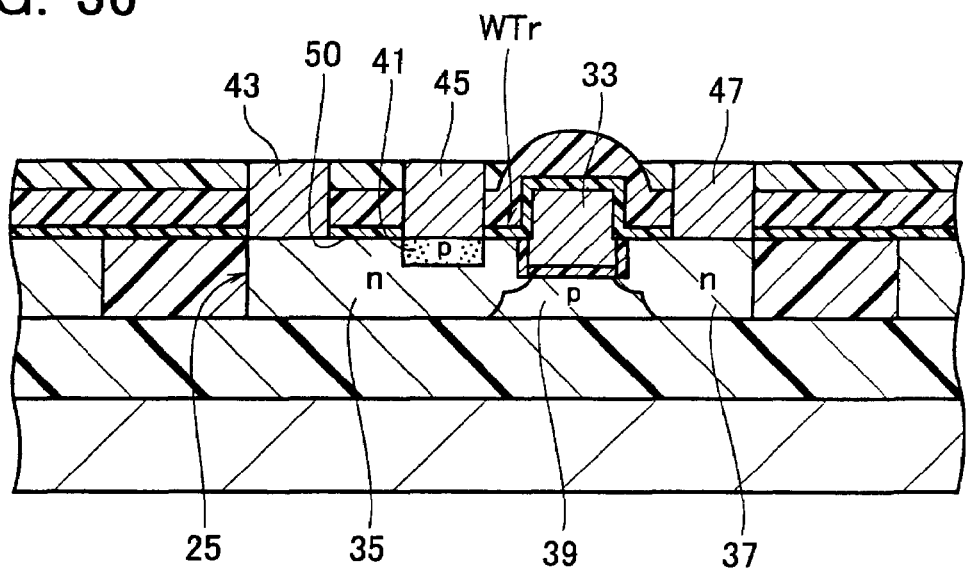
FIG. 36 is a process diagram of a tenth step in the method.
Figure 37:
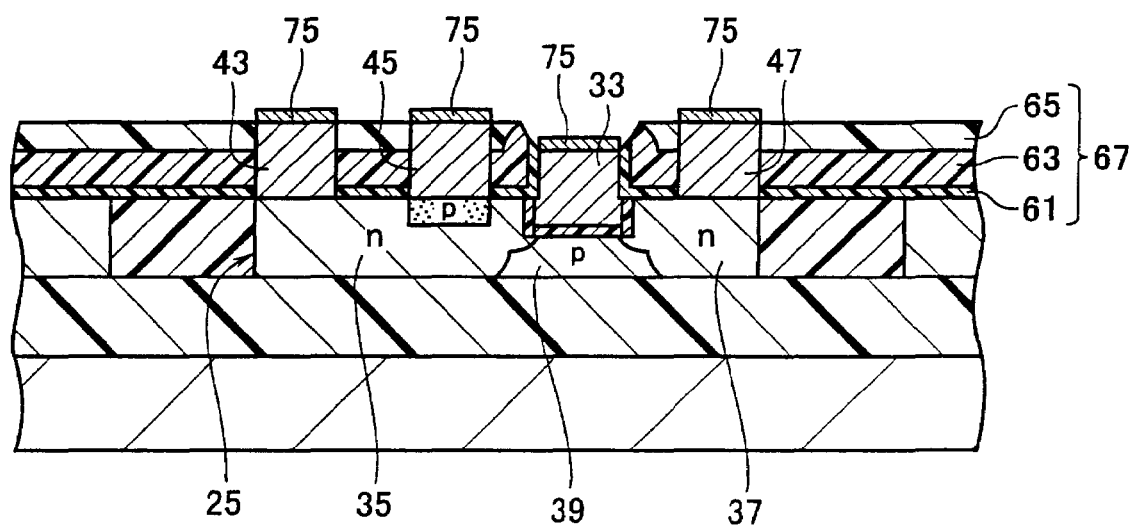
FIG. 37 is a process diagram of an eleventh step in the method.

Then, as shown in FIG. 28, a process of thermal oxidation is employed to form a thin insulator film serving as the gate insulator film over the silicon layer 25. A polysilicon film with a thickness of about 300 nm is formed on the insulator film by CVD. The polysilicon film and the thin insulator film are patterned by photolithography and reactive ion etching to form the gate electrode 33 and the gate insulator film 31 in the gate electrode formation region 79. Thus, the lower portion of the gate electrode 33 is buried in the gate electrode formation region 79.

Subsequent process steps are similar to those in the first embodiment. In a word, the process steps of FIGS. 13-22 in the first embodiment correspond to those of FIGS. 29-37 and FIG. 26.

Fourth Embodiment

Figure 38:
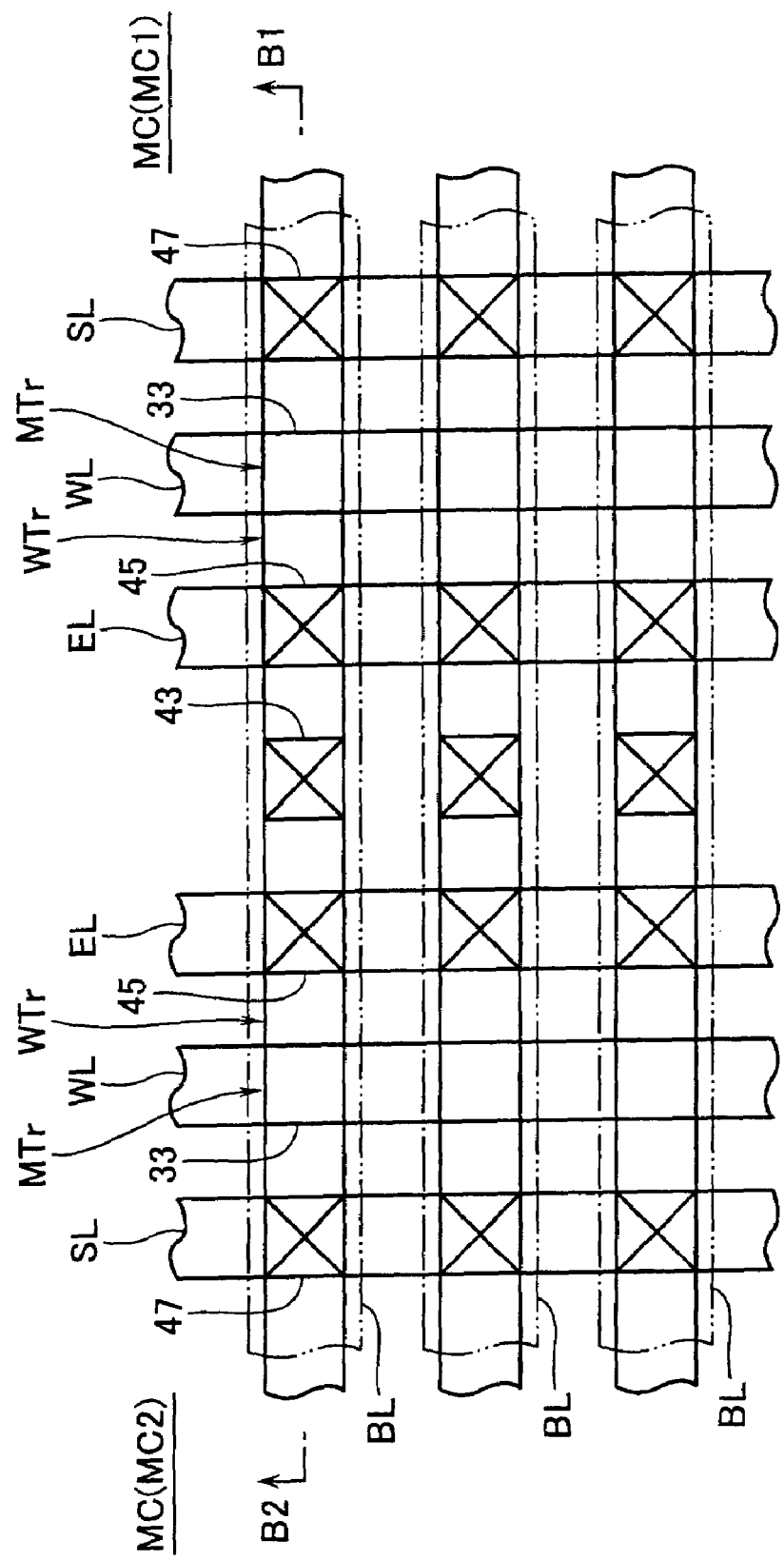
FIG. 38 is a plan view showing a layout of part of a cell array according to a fourth embodiment.
Figure 39:
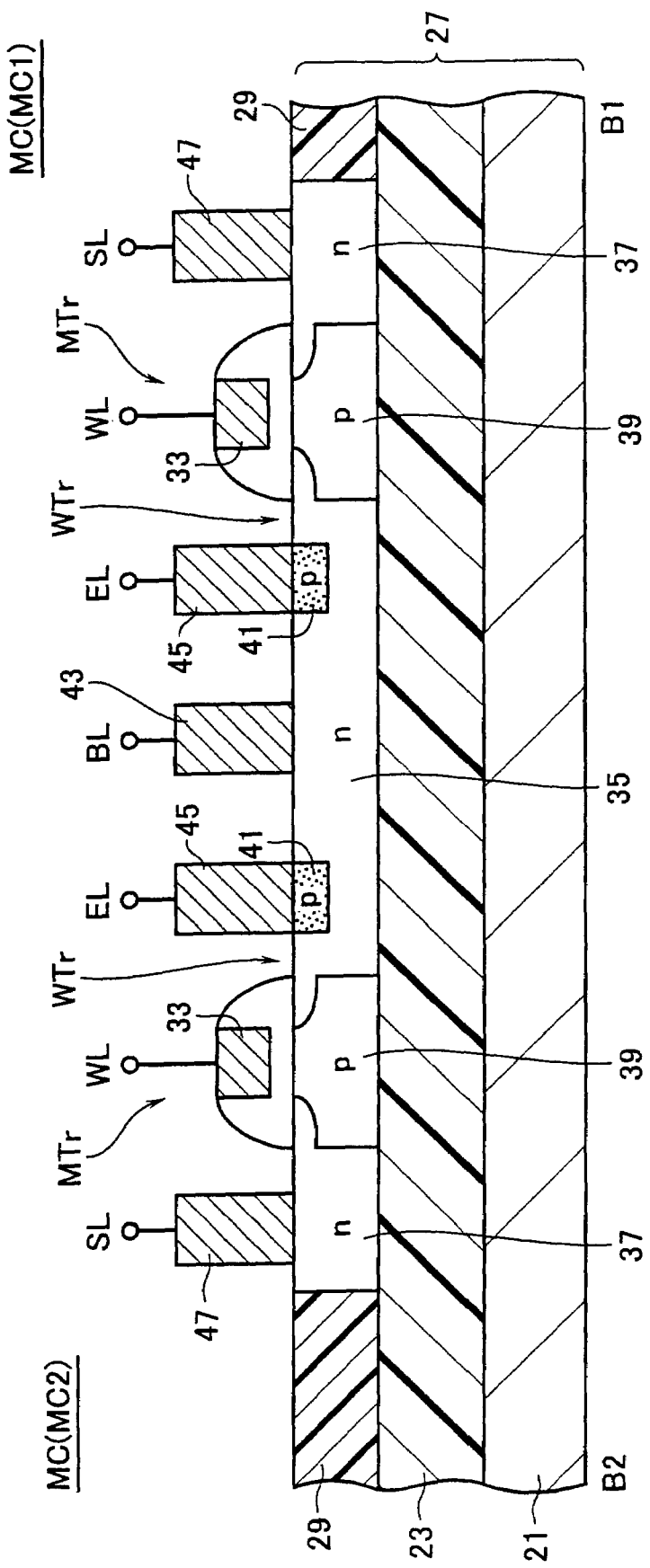
FIG. 39 is a schematic diagram of B1-B2 section in FIG. 38.

A fourth embodiment is mainly characterized in sharing of a drain plug by adjacent memory cells. FIG. 38 is a plan view showing an outline of part of a cell array according to the fourth embodiment, which corresponds to FIG. 23. FIG. 39 is a schematic diagram of B1-B2 section in FIG. 38, which corresponds to FIG. 24.

A difference from the first embodiment of FIGS. 23 and 24 is found in that the device isolation film 29 between the memory cell MC1 and the memory cell MC2 is omitted to allow the drain region 35 and the drain plug 43 to be shared. As a result, the area of a memory cell MC can be reduced to achieve a highly integrated semiconductor memory device.

Fifth Embodiment

Structure of Memory Cell in Fifth Embodiment

Figure 40:
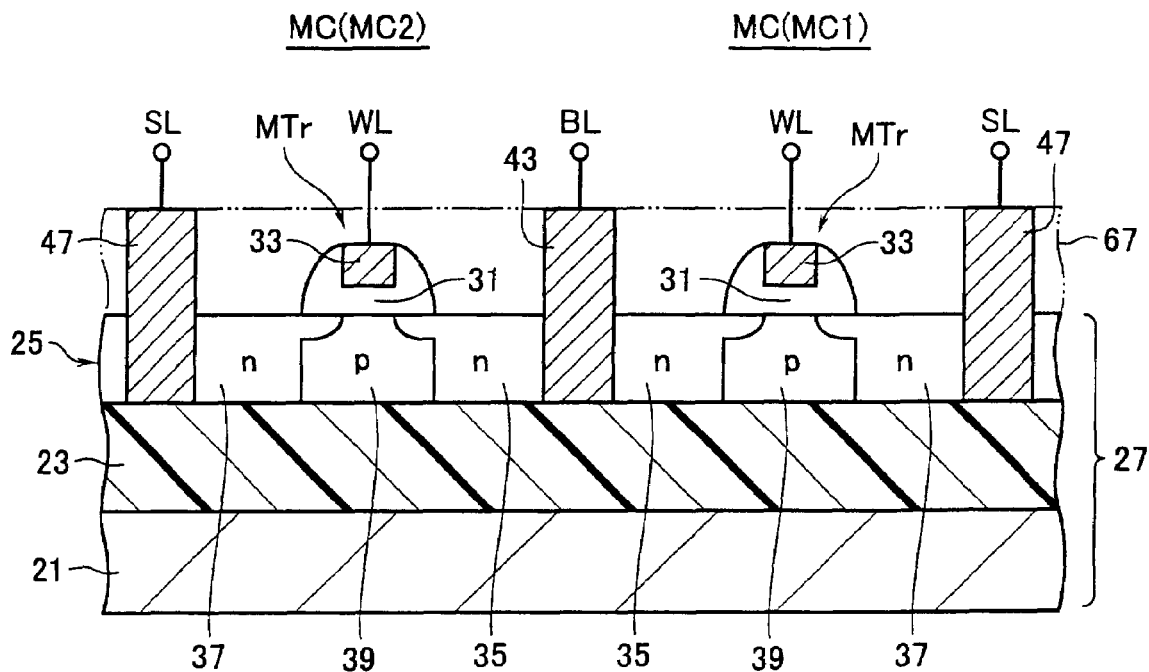
FIG. 40 is a schematic cross-sectional view of part of a cell array according to a fifth embodiment.

A fifth embodiment is mainly characterized in sharing of a drain plug by adjacent two memory cells, which plug is formed to reach the silicon oxide layer in the SOI substrate. FIG. 40 is a schematic cross-sectional view of part of a cell array according to the fifth embodiment showing adjacent two memory cells MC1 and MC2. The drain region 35 and the source region 37 are a pair of impurity regions. The memory cells MC1 and MC2 share the drain region 35 or one of the pair of impurity regions.

The memory cell MC of the fifth embodiment comprises a single memory transistor MTr like the first comparative example shown in FIG. 1. Accordingly, it is not configured to comprise the impurity-diffused region 41 (emitter region) and the emitter plug 45, which are formed in the first embodiment of FIG. 7. The area occupied by the memory cell MC is reduced by: (1) not forming the device isolation film 29; and (2) sharing the drain plug 43 and the source plug 47.

The fifth embodiment is provided with the interlayer insulator film 67 that covers the memory transistor MTr and receives the drain plug 43 and the source plug 47 buried therein. The drain plug 43 projects through the interlayer insulator film 67, gets buried in the drain region 35, and reaches the silicon oxide layer 23. Similarly, the source plug 47 projects through the interlayer insulator film 67, gets buried in the source region 37, and reaches the silicon oxide layer 23. The plugs 43 and 47 are of n-type.

Main Effects of Fifth Embodiment

Figure 41:
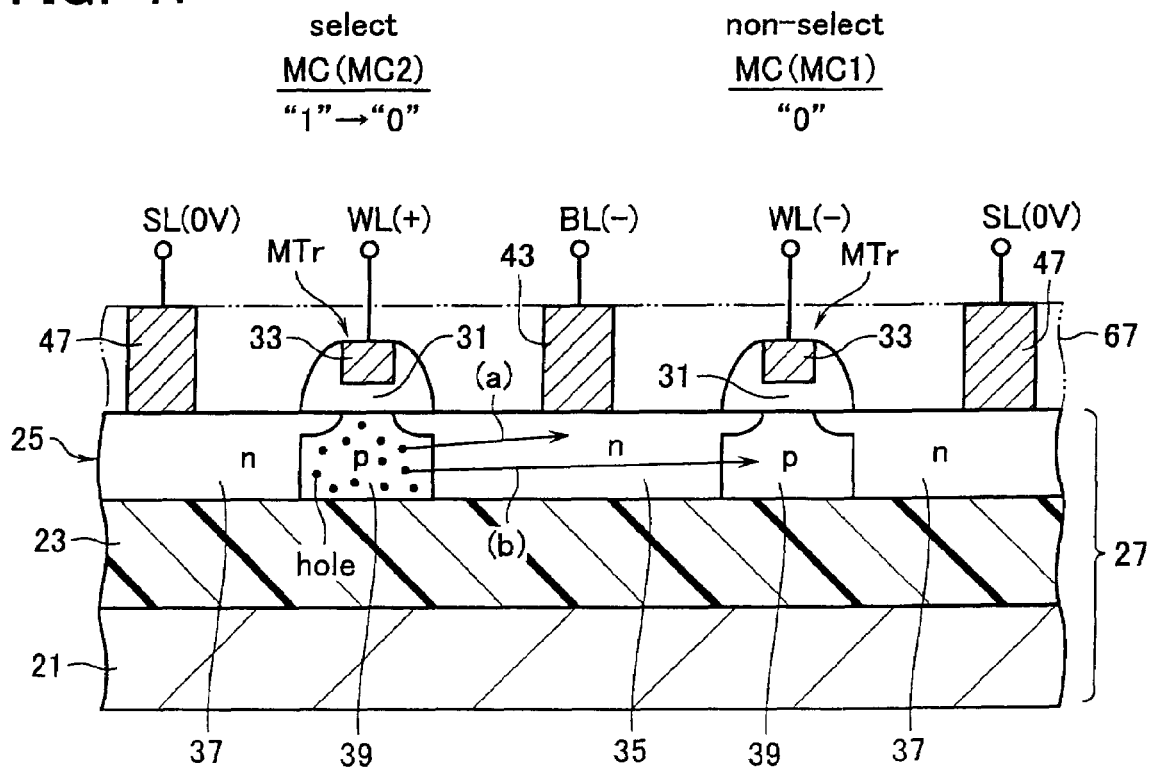
FIG. 41 shows operation of a memory cell according to a third comparative example.

The fifth embodiment has effects, which are described in comparison with a third comparative example. FIG. 41 is a schematic cross-sectional view of a memory cell according to the third comparative example. A difference from the fifth embodiment of FIG. 40 is found in that the drain plug 43 is located on the drain region 35 and the source plug 47 on the source region 37.

It is assumed in the third comparative example of FIG. 41 that data "1" is stored in the memory cell MC2 and data "0" in the memory cell MC1. The "1"-stored state means that a majority of holes are accumulated in the channel body 39. To the contrary, the "0"-stored state means that holes are not present in the channel body 39.

In order to select the memory cell MC2 to rewrite the data from "1" to "0", a positive voltage is applied to the word line WL of the memory cell MC2 and a negative voltage to the bit line BL. Holes in the channel body 39 of the memory cell MC2 are injected from the channel body 39 into the drain region 35 connected to the bit line BL as indicated by (a) and recombined therein.

As holes have a long diffusion length, part of the holes injected into the drain region 35 may flow in the channel body of the non-selected adjacent memory cell MC1 as indicated by (b). This flow causes a problem because it destroys the data "0" stored in the non-selected memory cell MC1 (Disturb by a parasitic pnp bipolar transistor). In a word, when majority carriers excessively accumulated inside the channel body 39 of a memory cell flow in an adjacent memory cell, the flow invites data destruction in the adjacent memory cell.

Figure 42:
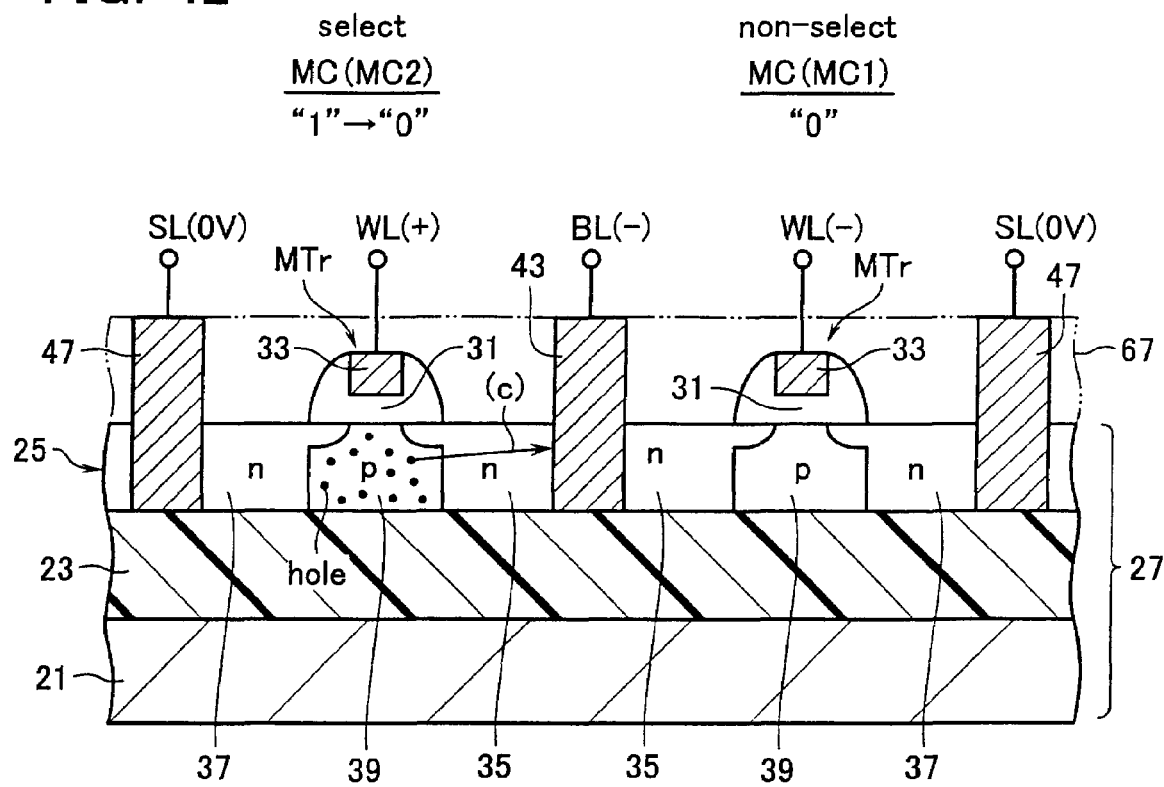
FIG. 42 shows operation of a memory cell according to a fifth embodiment.

The fifth embodiment is described to the contrary with reference to FIG. 42, which shows the same section as that of FIG. 40. FIG. 42 shows the same state of operation as that in the third comparative example of FIG. 41. In the fifth embodiment the drain plug 43 reaches the silicon oxide layer 23 and accordingly divides the drain region 35 in the memory cell MC1 from the drain region 35 in the memory cell MC2. Therefore, holes in the channel body 39 of the memory cell MC1 dissipate when they recombine at an interface between the drain plug 43 and the drain region 35 as indicated by (c). As a result, minority carriers or holes can not flow in the adjacent memory cell MC1, which is thus protected from data destruction. As the drain plug 43 reaches the silicon oxide layer 23, in comparison with a later described sixth embodiment, a higher effect is achieved to prevent holes from flowing in the adjacent memory cell MC1.

In the state of FIG. 42, a negative voltage is applied to the bit line BL of the memory cell MC2 and 0 V to the source line SL. Accordingly, holes in the channel body 39 of the memory cell MC2 flow in the drain plug 43 mainly as well as in the source plug 47 partly. In the fifth embodiment, therefore, the source plug 47 is also formed to reach the silicon oxide layer 23. This is effective to prevent holes in the channel body 39 of the memory cell MC2 from flowing in an adjacent memory cell (not shown) at the source plug 47, which is thus protected from data destruction.

Method of Manufacturing Memory Cell in Fifth Embodiment

Figure 43:
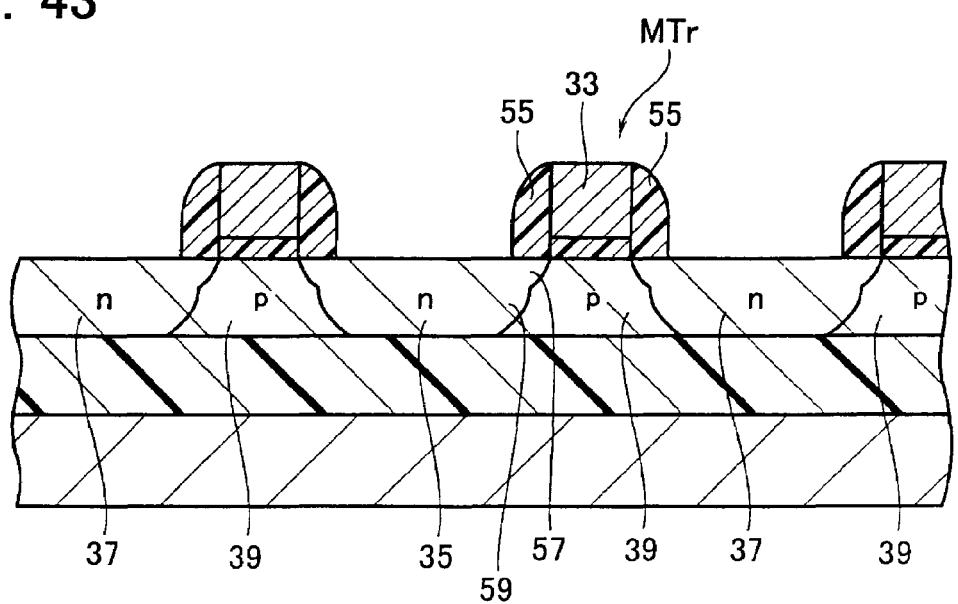
FIG. 43 is a process diagram of a first step in a method of manufacturing the memory cell according to the fifth embodiment.
Figure 44:
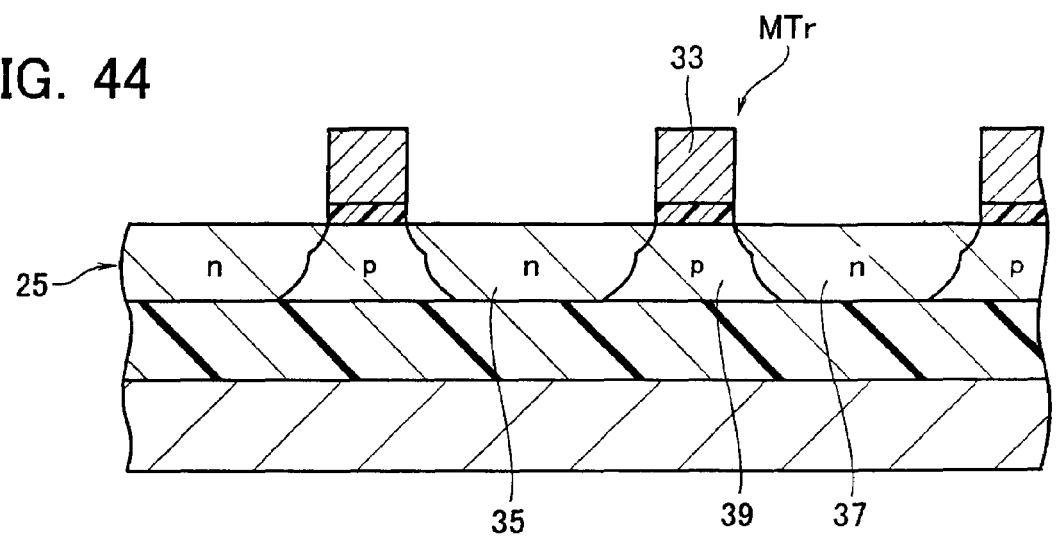
FIG. 44 is a process diagram of a second step in the method.
Figure 45:
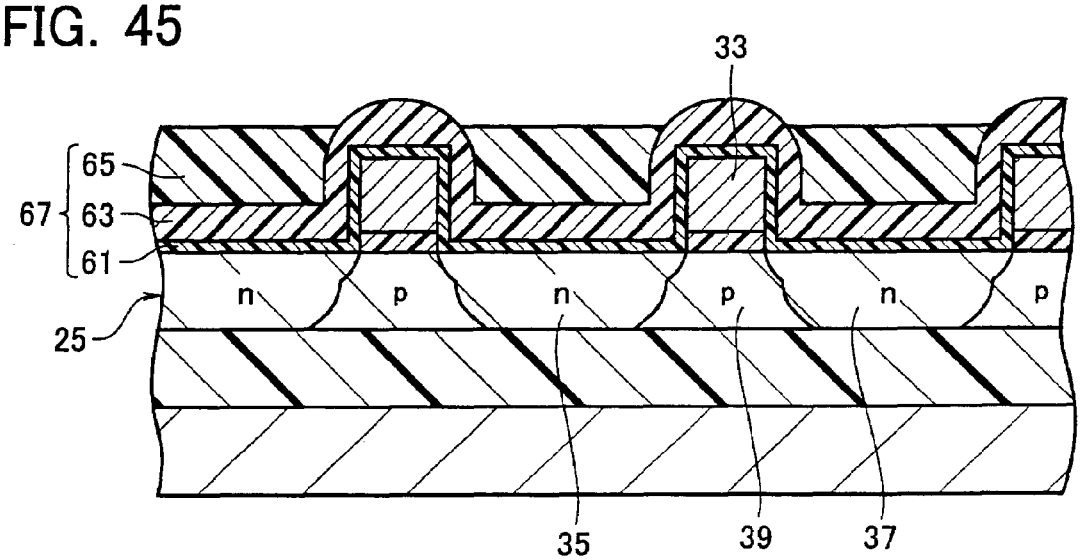
FIG. 45 is a process diagram of a third step in the method.

FIGS. 43-49 are cross sectional views of the SOI substrate and others showing a method of manufacturing according to the fifth embodiment in order of process steps. First, it undergoes the steps of FIGS. 10-12 described in the first embodiment except for formation of the device isolation film around the device formation region 51. Therefore, the memory transistors MTr are formed to share the drain region 35 or the source region 37 by adjacent memory transistors. The material of the gate electrode 33, or the polysilicon film, has a thickness of 150 nm. The step of FIG. 43 is then performed. This step is similar to that of FIG. 13. The following steps of FIGS. 44 and 45 are similar to those of FIGS. 14 and 15.

Figure 46:
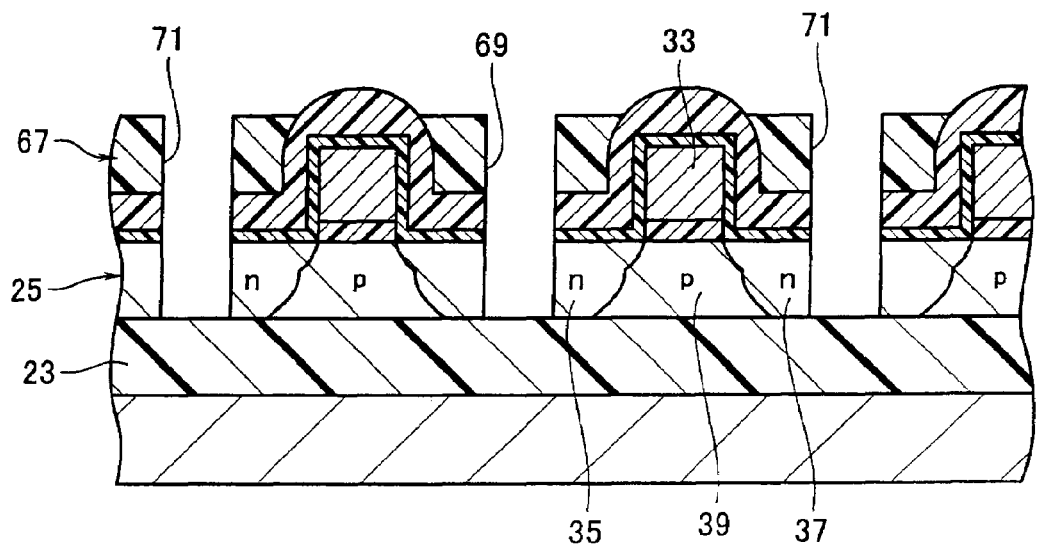
FIG. 46 is a process diagram of a fourth step in the method.

The step of FIG. 46 is then performed. This step corresponds to that of FIG. 16 except for the depth of the drain contact hole 69 and the source contact hole 71. In the fifth embodiment these contact holes 69 and 71 are formed to enter inside the drain region 35 and the source region 37, pass through the drain region 35 and the source region 37, and reach the silicon oxide layer 23 in the SOI substrate.

Figure 47:
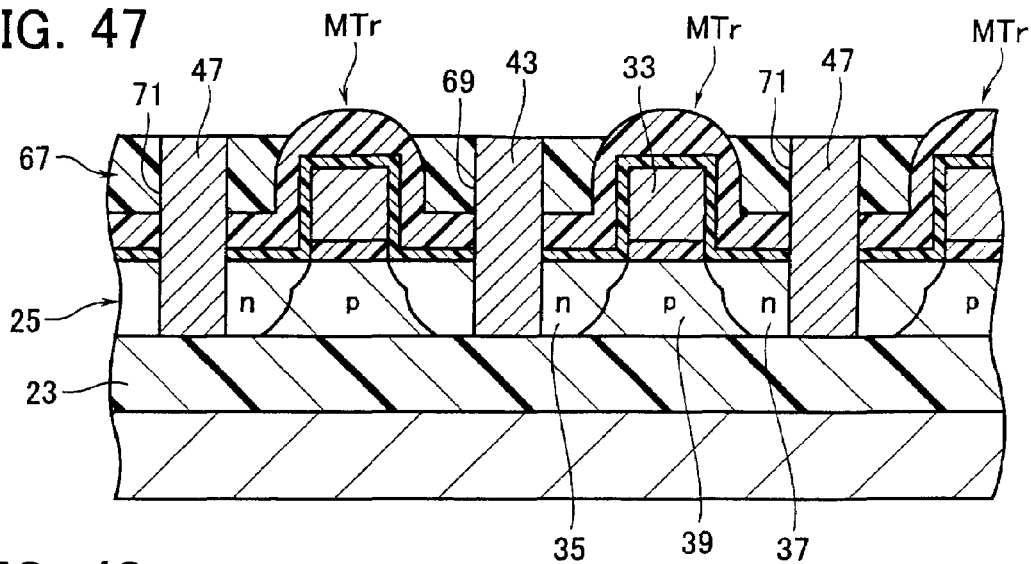
FIG. 47 is a process diagram of a fifth step in the method.
Figure 48:
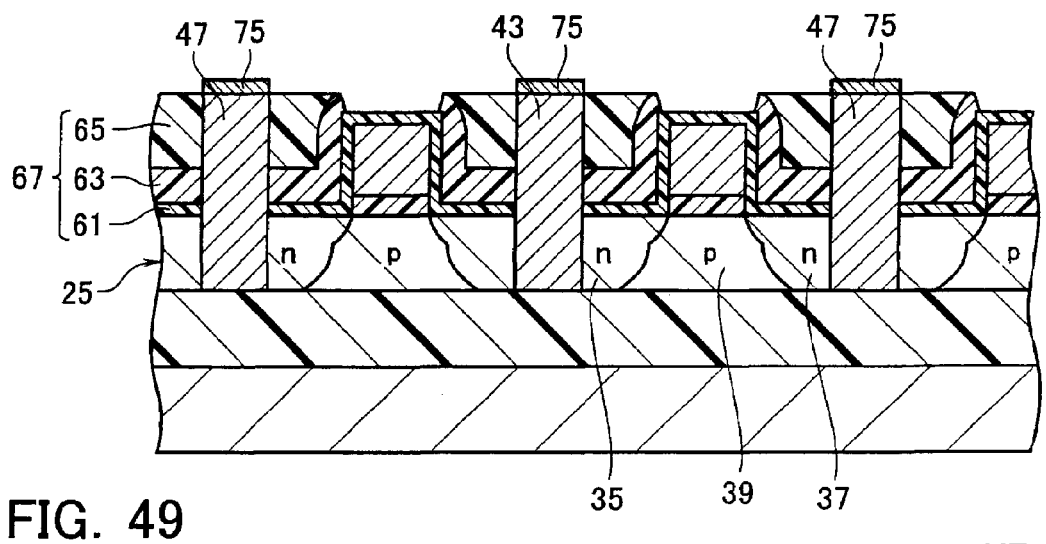
FIG. 48 is a process diagram of a sixth step in the method.
Figure 49:
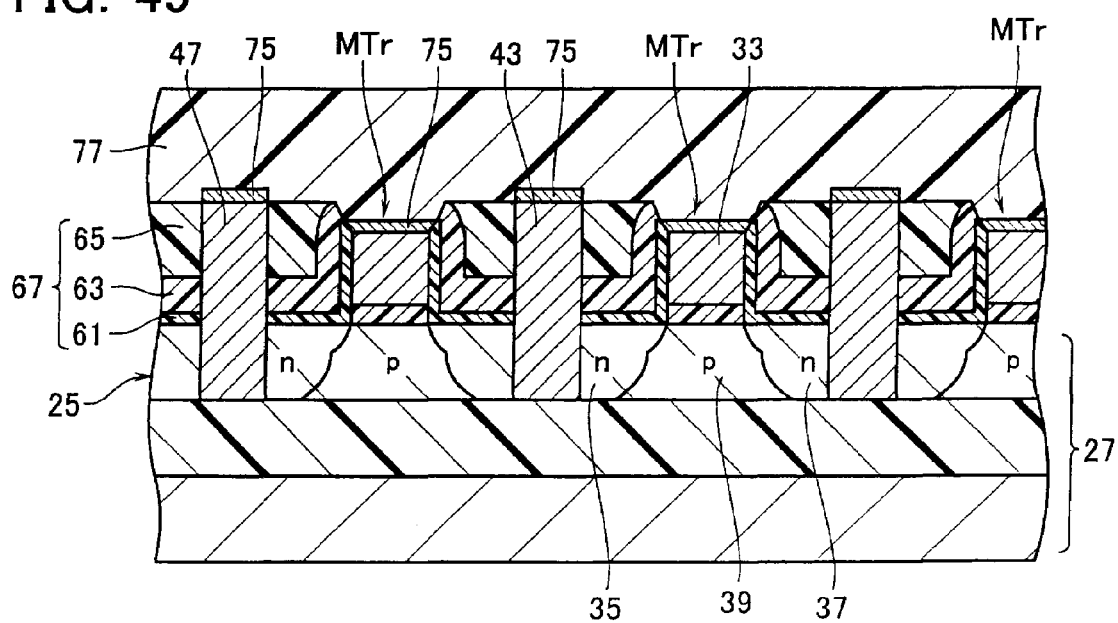
FIG. 49 is a process diagram of a seventh step in the method.

The step of FIG. 47 is performed next. This step corresponds to that of FIG. 17 except that the drain plug 43 is formed in the drain contact hole 69 so as to enter inside the drain region 35 and reach the silicon oxide layer 23, and is shared by adjacent memory transistors MTr. Similarly, the source plug 47 is formed in the source contact hole 71 so as to enter inside the source region 37 and reach the silicon oxide layer 23, and is shared by adjacent memory transistors MTr. Subsequent steps of FIGS. 48 and 49 are same as those of FIGS. 21 and 22, respectively.

Sixth Embodiment

Figure 50:
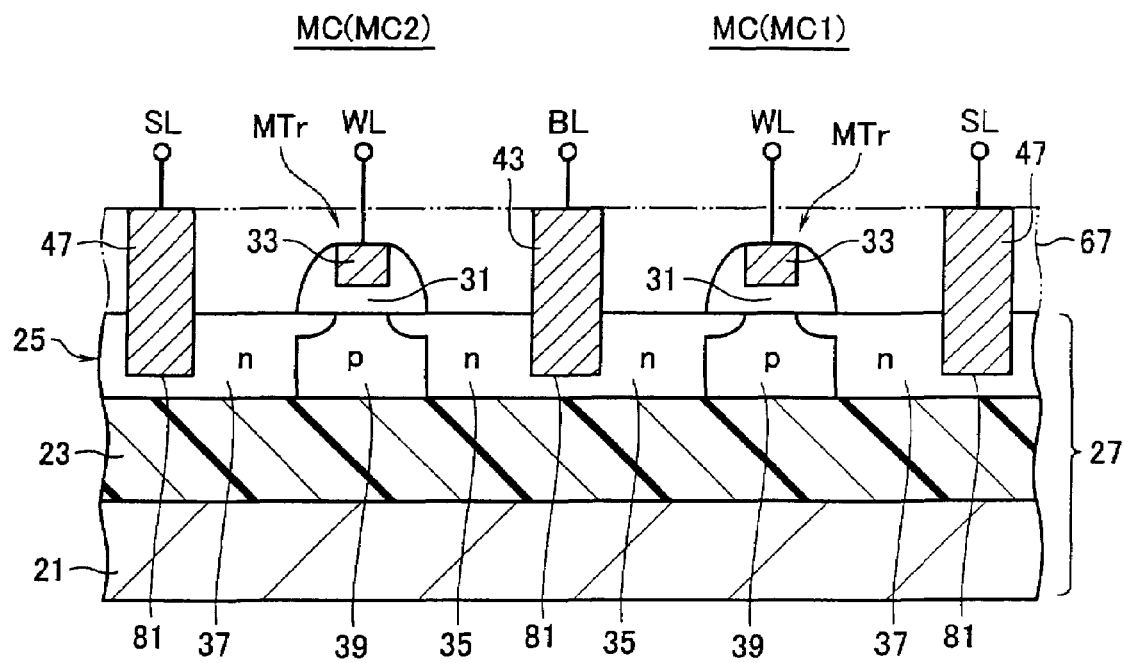
FIG. 50 is a schematic cross-sectional view of part of a cell array according to a sixth embodiment.

FIG. 50 is a schematic cross-sectional view of part of a cell array according to a sixth embodiment, which corresponds to FIG. 40 in the fifth embodiment. A difference from FIG. 40 is found in that the drain plug 43 and the source plug 47 buried in the silicon layer 25 are not formed to reach the silicon oxide layer 23.

Similar to the fifth embodiment, the sixth embodiment is also possible to prevent minority carriers or holes from flowing in an adjacent memory cell, which is thus protected from data destruction. In the sixth embodiment, as the bottom 81 of the drain plug 43 also contacts with the drain region 35, the drain plug 43 has a larger contact area with the drain region 35 than that of the fifth embodiment. Thus, the sixth embodiment is possible to reduce the contact resistance of the drain plug 43, as similar to the source plug 47.

The structure of the sixth embodiment can be achieved by halting the etching in the step of FIG. 46 in the fifth embodiment before the drain contact hole 69 and the source contact hole 71 reach the silicon oxide layer 23 after entering inside the drain region 35 and the source region 37, respectively.

Seventh Embodiment

Figure 51:
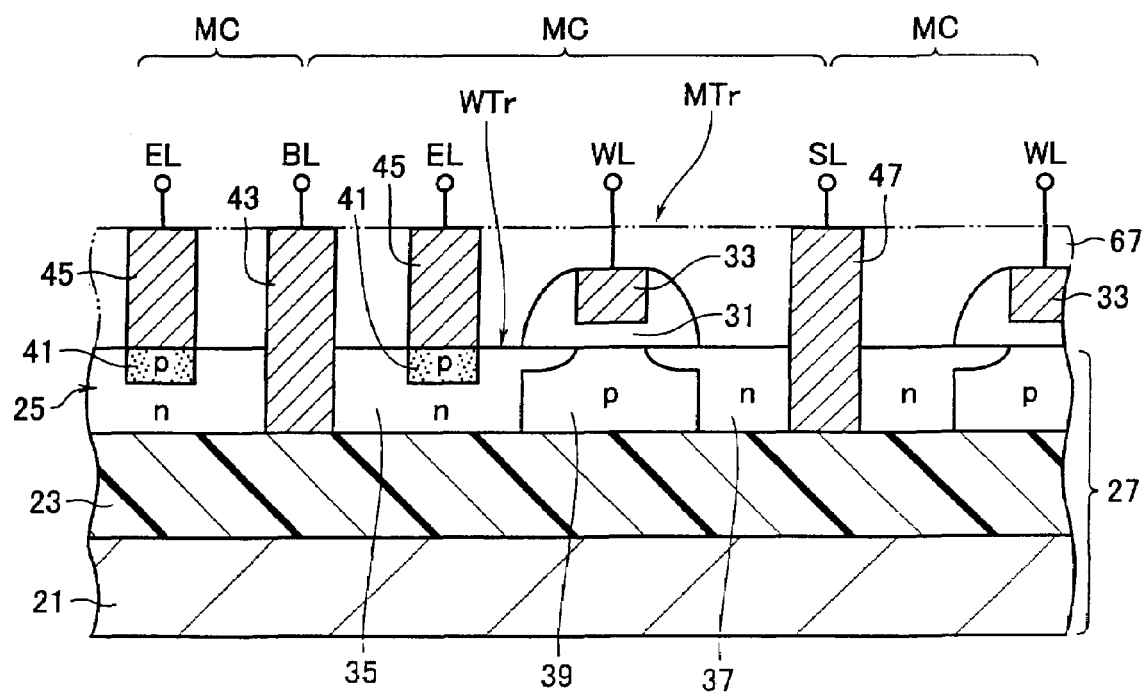
FIG. 51 is a schematic cross-sectional view of part of a cell array according to a seventh embodiment.

FIG. 51 is a schematic cross-sectional view of part of a cell array according to a seventh embodiment, which is a combination of the first embodiment in FIG. 7 and the fifth embodiment in FIG. 40. In a word, the drain plug 43 is buried in the interlayer insulator film 67 covering the memory transistor MTr and the write transistor WTr and connected to the drain region 35. In this case, the drain plug 43 projects through the interlayer insulator film 67, gets buried in the drain region 35, and reaches the silicon oxide layer 23. Similarly, the source plug 47 projects through the interlayer insulator film 67, gets buried in the source region 37, and reaches the silicon oxide layer 23.

Therefore, the seventh embodiment is possible to achieve quick bipolar write and prevent data destruction in the adjacent memory cell MC.

In the second comparative example of FIG. 9, as the plug located outward is the emitter plug 45, adjacent memory cells MC can not share the plug located outward in the seventh embodiment of FIG. 51 (the drain plug 43). This is because adjacent memory cells MC1 and MC2 share the bit line BL in the extending direction of the bit line BL as can be seen from FIG. 23. In this case, if they also share the emitter line EL, these memory cells can not obtain the selectivity on "1" write.

Figure 52:
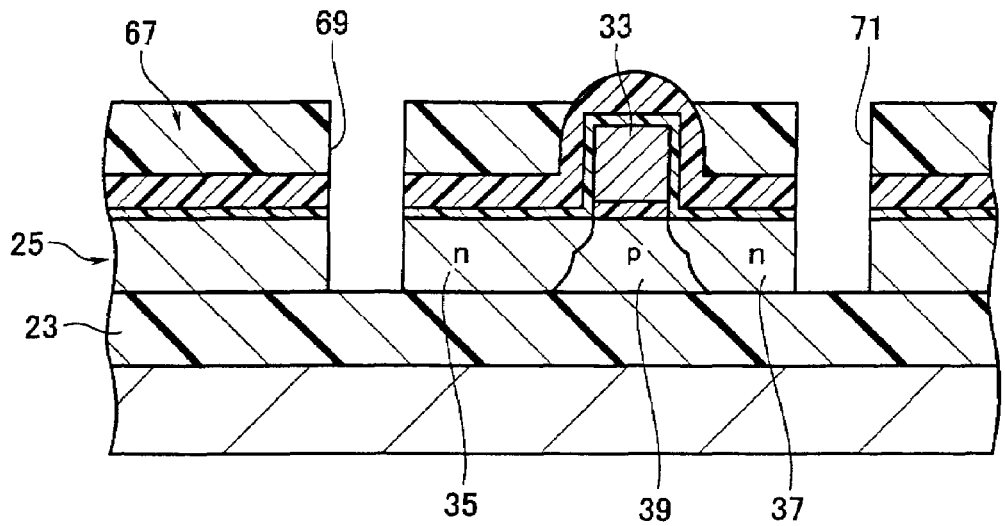
FIG. 52 is a process diagram of a first step in a method of manufacturing the memory cell according to the seventh embodiment.

A method of manufacturing according to the seventh embodiment is described based on FIGS. 52-58, which are cross sectional views of the SOI substrate and others showing the method in the seventh embodiment in order of process steps. First, it undergoes the steps of FIGS. 10-15 described in the first embodiment except for formation of the device isolation film 29 around the device formation region 51. The step of FIG. 52 is then performed. This step corresponds to that of FIG. 16 except that the drain contact hole 69 and the source contact hole 71 reach the silicon oxide layer 23.

Figure 53:
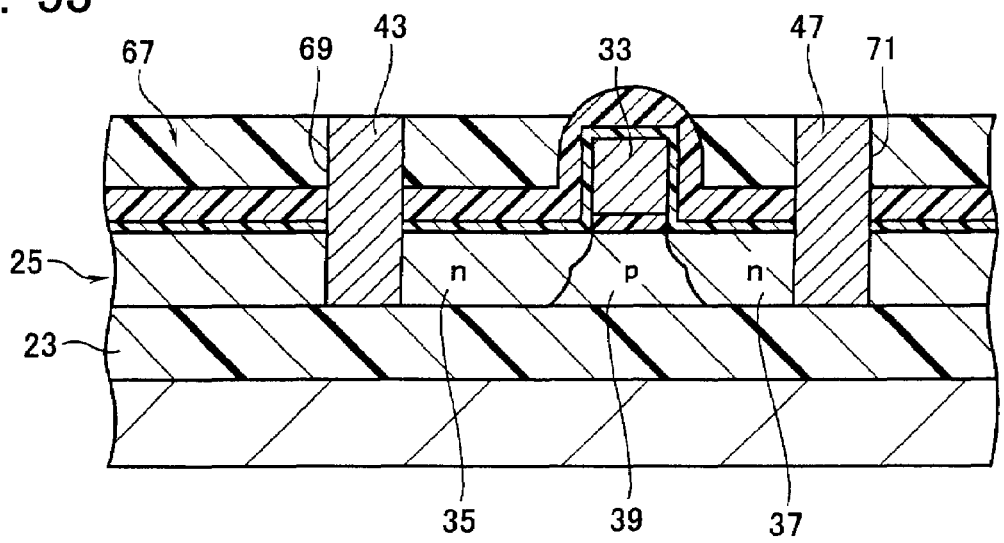
FIG. 53 is a process diagram of a second step in the method.
Figure 54:
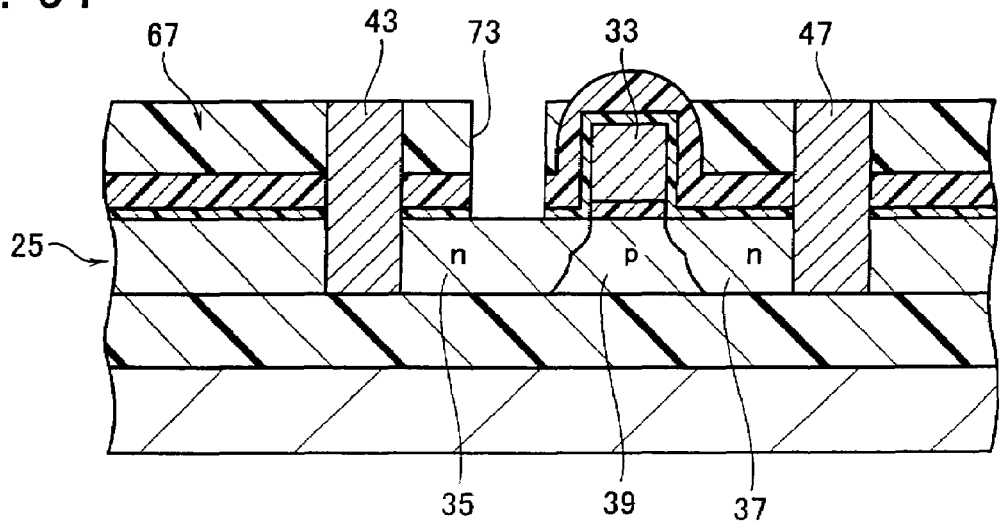
FIG. 54 is a process diagram of a third step in the method.
Figure 55:
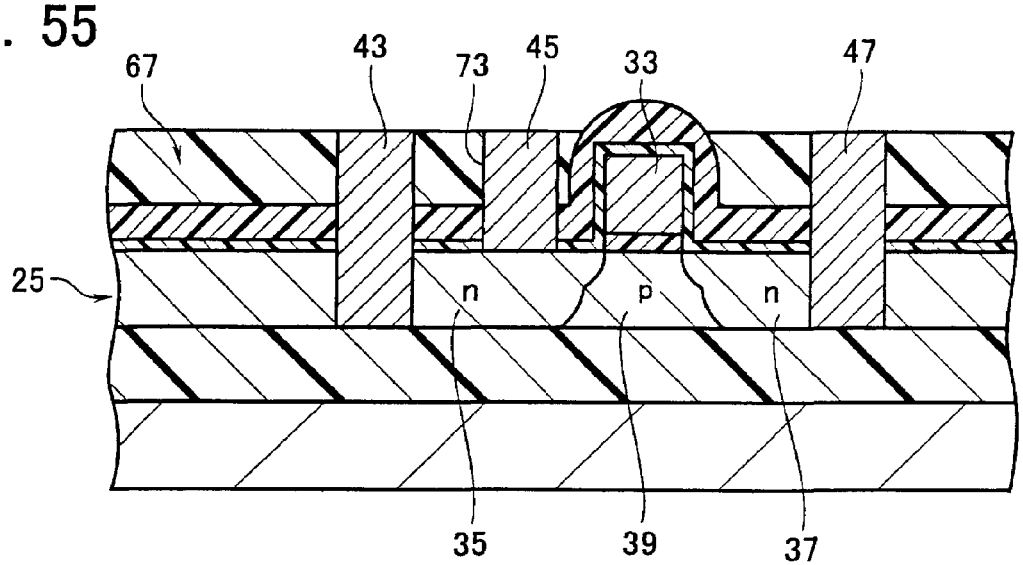
FIG. 55 is a process diagram of a fourth step in the method.
Figure 56:
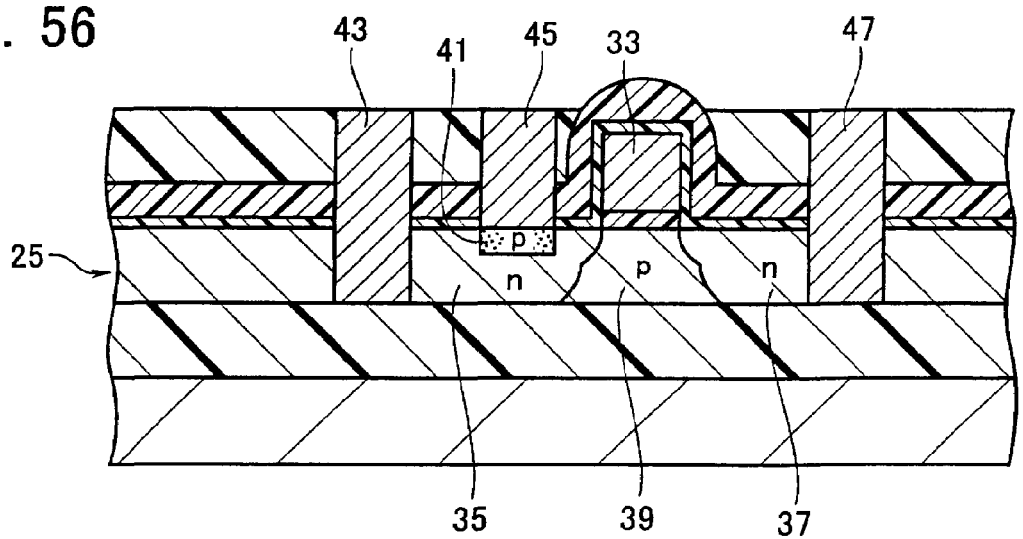
FIG. 56 is a process diagram of a fifth step in the method.
Figure 57:
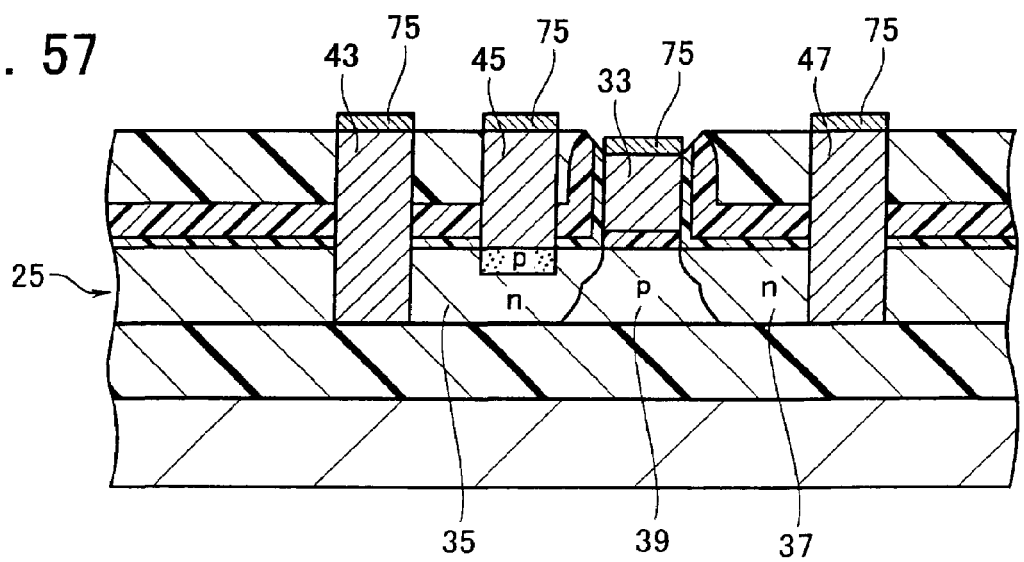
FIG. 57 is a process diagram of a sixth step in the method.
Figure 58:
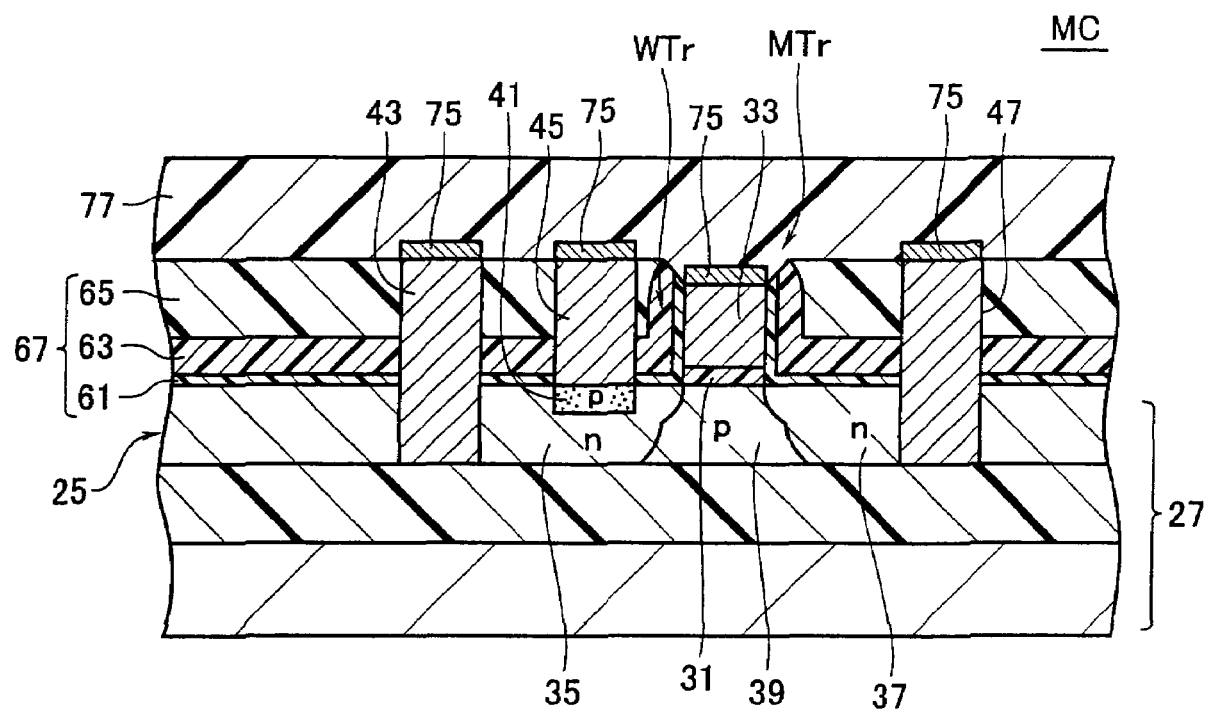
FIG. 58 is a process diagram of a seventh step in the method.

The step of FIG. 53 corresponds to that of FIG. 17 except that the drain contact hole 69 and the source contact hole 71 reach the silicon oxide layer 23 and accordingly the drain plug 43 and the source plug 47 also contact with the silicon oxide layer 23. The steps of FIGS. 54-58 are similar to those of FIGS. 18-22.

As obvious from the foregoing, an aspect of the present invention provides a semiconductor memory device capable of quick writing of data and method of manufacturing the same. In addition, another aspect of the present invention provides a semiconductor memory device capable of preventing occurrences of data destruction and method of manufacturing the same.

What is claimed is:

1. A semiconductor memory device, comprising:
a substrate;
a semiconductor layer of a first conductive type isolated from said substrate by an insulator layer;
a memory transistor having a gate electrode, a drain and a source regions of a second conductive type formed in said semiconductor layer, the second conductive type being of an opposite conductive type to said first conductive type, and a channel body of said first conductive type formed in said semiconductor layer between said regions, said memory transistor operative to store data as a state of majority carriers accumulated in said channel body;
an impurity-diffused region of said first conductive type formed at a location in contact with the upper surface of said drain region, said impurity-diffused region having a higher impurity concentration of said first conductive type than an impurity concentration of said second conductive type in said drain region;
a write transistor including a bipolar transistor having said impurity-diffused region as an emitter region, said drain region as a base region and said channel body as a collector region, the emitter region being spaced from the channel body with the drain region sandwiched therebetween, said write transistor operative to write data in said memory transistor; and
an emitter plug connected to said drain region,
wherein said impurity-diffused region is formed in said drain region shallower than said drain region, and said impurity-diffused region is formed to contain an impurity of said first conductive type diffused from inside said emitter plug to said drain region.

2. The semiconductor memory device according claim 1, wherein said emitter plug contains polysilicon of said first conductivity type.

3. The semiconductor memory device according claim 1, wherein said emitter plug contains a single crystalline structure.

4. The semiconductor memory device comprising:
a substrate;
a semiconductor layer of a first conductive type isolated from said substrate by an insulator layer;
a memory transistor having a gate electrode, a drain and a source regions of a second conductive type formed in said semiconductor layer, and a channel body of said first conductive type formed in said semiconductor layer between said regions, said memory transistor operative to store data as a state of majority carriers accumulated in said channel body;
an impurity-diffused region of said first conductive type formed at a location in contact with the upper surface of said drain region, said impurity-diffused region having a higher impurity concentration of said first conductive type than an impurity concentration of said second conductive type in said drain region;
a write transistor including a bipolar transistor having said impurity-diffused region as an emitter region, said drain region as a base region and said channel body as a collector region, said write transistor operative to write data in said memory transistor;
a conductive source plug connected to said source region;
a conductive emitter plug connected to said impurity-diffused region; and a conductive drain plug connected to said drain region,
wherein said source plug, said gate electrode, said emitter plug and said drain plug are aligned in this order.

5. The semiconductor memory device according claim 4, wherein a set of said memory transistor and said write transistor configures a memory cell, and wherein in adjacent memory cells, said source plug, said gate electrode, said emitter plug and said drain plug in one of said memory cells, and said drain plug, said emitter plug, said gate electrode and said source plug in the other of said memory cells are aligned in this order.

6. The semiconductor memory device according claim 5, wherein said adjacent memory cells share said drain plug.

7. The semiconductor memory device according claim 1, further comprising:
an interlayer insulator film formed to cover said memory transistor and said write transistor; and
a conductive drain plug buried in said interlayer insulator film and connected to said drain region, wherein said drain plug is projected through said interlayer insulator film and buried in said drain region so as to reach said insulator layer.

8. The semiconductor memory device according claim 1, wherein at least part of said gate electrode is buried in said semiconductor layer.

9. The semiconductor memory device according claim 1, wherein said impurity-diffused region has an impurity concentration of said first conductive type ranging from $1 \times 10^{20}/\text{cm}^3$ to $1 \times 10^{21}/\text{cm}^3$.

10. The semiconductor memory device according claim 5, further comprising:
a cell array including a plurality of said memory cells arranged in matrix; and
a transistor formed in said semiconductor layer and operative to serve as a component in a peripheral circuit of said cell array.

11. The semiconductor memory device according claim 1, wherein said memory transistor stores either a first data state in which said channel body holds excess majority carriers or a second data state in which said channel body holds less majority carriers than said first data state.

* * * * *